(12) United States Patent
Choi et al.

(10) Patent No.: US 9,972,692 B2
(45) Date of Patent: May 15, 2018

(54) INTEGRATED CIRCUIT DEVICE AND METHOD OF MANUFACTURING THE SAME

(71) Applicants: Jung-Hun Choi, Seoul (KR); Da-Il Eom, Goyang-si (KR); Sun-Jung Lee, Hwaseong-si (KR); Sung-Uk Jang, Seoul (KR)

(72) Inventors: Jung-Hun Choi, Seoul (KR); Da-Il Eom, Goyang-si (KR); Sun-Jung Lee, Hwaseong-si (KR); Sung-Uk Jang, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 221 days.

(21) Appl. No.: 14/994,167

(22) Filed: Jan. 13, 2016

(65) Prior Publication Data
US 2016/0233164 A1   Aug. 11, 2016

(30) Foreign Application Priority Data

Feb. 10, 2015 (KR) .................. 10-2015-0020290

(51) Int. Cl.
| | |
|---|---|
| *H01L 29/417* | (2006.01) |
| *H01L 27/092* | (2006.01) |
| *H01L 29/08* | (2006.01) |
| *H01L 29/16* | (2006.01) |
| *H01L 29/165* | (2006.01) |

(Continued)

(52) U.S. Cl.
CPC .. *H01L 29/41791* (2013.01); *H01L 21/76846* (2013.01); *H01L 21/823418* (2013.01); *H01L 21/823425* (2013.01); *H01L 21/823431* (2013.01); *H01L 21/823475* (2013.01); *H01L 21/823814* (2013.01); *H01L 21/823871* (2013.01); *H01L 23/485* (2013.01); *H01L 27/0924* (2013.01); *H01L 29/0847* (2013.01); *H01L 29/1604* (2013.01);

(Continued)

(58) Field of Classification Search
CPC .......... H01L 29/41791; H01L 29/0924; H01L 29/41783; H01L 2029/7858; H01L 21/823821; H01L 21/823431; H01L 21/823475; H01L 21/76846; H01L 21/823418; H01L 21/823814; H01L 21/823871

See application file for complete search history.

(56) References Cited

U.S. PATENT DOCUMENTS

| | | | |
|---|---|---|---|
| 7,052,965 B2 | 5/2006 | Park et al. | |
| 7,410,875 B2 | 8/2008 | Ting et al. | |

(Continued)

*Primary Examiner* — Joseph C Nicely
(74) *Attorney, Agent, or Firm* — Volentine, Whitt & Francos, PLLC

(57) ABSTRACT

An integrated circuit device includes a source/drain region having a recess in its top, a contact plug extending on the source/drain region from within the recess, and a metal silicide layer lining the recess and having a first portion covering a bottom of the contact plug and a second portion that is integral with the first portion and covers a lower part of the sides of the contact plug. The second portion of the silicide layer may have a thickness different from a thickness of the first portion of the silicide layer. The silicide layer is formed at a relatively low temperature to offer an improved resistance characteristic as between the source/drain region and the contact plug.

20 Claims, 50 Drawing Sheets

(51) Int. Cl.
   *H01L 21/8238* (2006.01)
   *H01L 21/768* (2006.01)
   *H01L 21/8234* (2006.01)
   *H01L 23/485* (2006.01)
   *H01L 29/78* (2006.01)

(52) U.S. Cl.
   CPC ...... *H01L 29/165* (2013.01); *H01L 29/41783* (2013.01); *H01L 2029/7858* (2013.01)

(56) References Cited

U.S. PATENT DOCUMENTS

| | | |
|---|---|---|
| 7,453,120 B2 | 11/2008 | Ting et al. |
| 7,569,896 B2 | 8/2009 | Ko et al. |
| 7,649,232 B2 | 1/2010 | Tamura et al. |
| 8,358,012 B2 | 1/2013 | Haran et al. |
| 8,492,854 B1 | 7/2013 | Cheng et al. |
| 8,541,280 B2 | 9/2013 | Yin et al. |
| 8,647,929 B2 | 2/2014 | Han |
| 8,822,293 B2 | 9/2014 | Yu et al. |
| 2008/0190760 A1 | 8/2008 | Tang et al. |
| 2013/0189839 A1 | 7/2013 | Guillorn et al. |
| 2016/0233164 A1* | 8/2016 | Choi .................... H01L 27/0924 |
| 2017/0250266 A1* | 8/2017 | Huang ............... H01L 29/66795 |
| 2017/0338318 A1* | 11/2017 | Lin ................... H01L 29/41791 |
| 2017/0358531 A1* | 12/2017 | Lin ................... H01L 23/53266 |
| 2017/0373159 A1* | 12/2017 | Cheng ............... H01L 29/41791 |

\* cited by examiner

INTEGRATED CIRCUIT DEVICE AND METHOD OF MANUFACTURING THE SAME

PRIORITY STATEMENT

This application claims the benefit of Korean Patent Application No. 10-2015-0020290, filed on Feb. 10, 2015, in the Korean Intellectual Property Office, the disclosure of which is incorporated herein in its entirety by reference.

BACKGROUND

The inventive concept relates to an integrated circuit device and to a method of manufacturing the same. More particularly, the inventive concept relates to an integrated circuit device including a fin field effect transistor and to a method of manufacturing the integrated circuit device.

Increasing the integration density of integrated circuit devices including field effect transistors (FETs), including by reducing the gate length of the field effect transistors (FETs), may compromise certain performance characteristics of the devices especially in the case of horizontal (planar) metal oxide semiconductor FETs (MOSFETs). To overcome these limitations, devices having three-dimensional channels such as FinFETs are being developed. However, the scaling down of a FinFET poses its own challenges. For instance, contact resistance between source and drain regions and a conductive contact plug connected to the source and drain regions of a FinFET may increase as the sizes of features of the FinFET are reduced. Contact resistance in this case may act as a main source of parasitic resistance of the integrated circuit device.

SUMMARY

According to an aspect of the inventive concept, there is provided an integrated circuit device including a substrate having a main surface, and a fin-type active region projecting upright on the main surface and extending longitudinally in a first direction parallel to the main surface, a gate line extending in a second direction across the fin-type active region, a source/drain region at an upper part of the fin-type active region disposed to the side of the gate line, the source/drain region having a recess in an upper portion thereof, a contact plug extending from within the recess, in a third direction perpendicular to the main surface of the substrate, so as to be disposed on the source/drain region, and a metal silicide layer extending along surfaces of the source/drain region defining the recess, and in which the metal silicide layer has a first portion covering a bottom surface of the contact plug and a second portion that is integral with the first portion and covers sides of a lower part of the contact plug, with a thickness of the first portion in the third direction being different than a thickness of the second portion in a direction parallel to the main surface of the substrate.

According to another aspect of the inventive concept, there is provided an integrated circuit device including a substrate spanning a first device region and a second device region of the device, a first channel-type transistor in the first device region, and a second channel-type transistor in the second device region, and in which the first channel-type transistor and the second channel-type transistor each include a fin-type active region of the substrate extending longitudinally in a first direction, a gate line extending in a second direction across the fin-type active region, a source/drain region at an upper part of the fin-type active region and disposed to the side of the gate line, the source/drain region having a recess in an upper portion thereof, a contact plug extending from within the recess, in a third direction perpendicular to the main surface of the substrate, so as to be disposed on the source/drain region, and a metal silicide layer extending along surfaces of the source/drain region defining the recess, in which the metal silicide layer has a first portion covering a bottom surface of the contact plug and a second portion that is integral with the first portion and covers sides of a lower part of the contact plug, a thickness of the first portion in the third direction being different than a thickness of the second portion in a direction parallel to the main surface of the substrate, and in which a bottom of the metal silicide layer of the first channel-type transistor is situated at a level in the device different from that at which a bottom of the metal silicide layer of the second channel-type transistor is situated.

According to another aspect of the inventive concept, there is provided the integrated circuit device including an active region of a substrate, a gate line extending across the active region, a source/drain region disposed to the side of the gate line at an upper part of the active region and having a recess in an upper portion thereof, a metal silicide layer extending along surfaces of the source/drain region defining the bottom and sides of the recess, a contact plug disposed on the metal silicide layer extending in a direction perpendicular to a main surface of the substrate from within the recess, and in which a first portion of the metal silicide layer covers a bottom surface of the contact plug and a second portion of the metal silicide layer, integral with the first portion, covers sides of a lower part of the contact plug, and in which the metal silicide layer is made by a process comprising forming a local metal layer in the recess at a temperature in a range of 15° C. to 40° C., and siliciding the local metal layer.

According to another aspect of the inventive concept, there is provided a method of manufacturing an integrated circuit device, the method including: forming a fin-type active region; forming a source/drain region in the fin-type active region; forming at least one insulation layer covering the source/drain region; forming a contact hole passing through the at least one insulation layer, on the source/drain region; forming a recess region on a top surface of the source/drain region by removing a portion of the source/drain region through the contact hole; forming a metal silicide layer having a first portion covering a bottom surface of the contact plug by a first thickness and a second portion that is integrally connected to the first portion and covers a sidewall of the contact plug at a side of the recess region by a second thickness that is different from the first thickness; and forming a contact plug extending from an inner portion of the recess region along the contact hole and connected to the source/drain region through the metal silicide layer.

According to another aspect of the inventive concept, there is provided a method of manufacturing an integrated circuit device, the method including: forming a fin-type active region; forming a semiconductor layer in the fin-type active region; forming a recess region having a bottom surface and a sidewall by removing a portion of the semiconductor layer; forming an amorphous semiconductor layer in the semiconductor layer by injecting a dopant into the semiconductor layer through the bottom surface and the sidewall of the recess region; forming a metal layer that abuts the amorphous semiconductor layer at the bottom surface and the sidewall of the recess region; forming a conductive barrier layer on the metal layer; forming a metal silicide layer having a first portion covering the amorphous semiconductor layer at the bottom surface of the recess region by a first thickness and a second portion that is integrally connected to the first portion and covers the amorphous semiconductor layer at the sidewall of the contact plug by a second thickness that is different from the first thickness, by reacting the metal layer with the amorphous semiconductor layer while the conductive barrier layer is covering the metal layer; and forming a conductive layer in the recess region and on the metal silicide layer.

BRIEF DESCRIPTION OF THE DRAWINGS

The inventive concept will be more clearly understood from the following detailed description of examples thereof made in conjunction with the accompanying drawings in which:

FIGS. 1A through 1D illustrate an example of an integrated circuit device according to the inventive concept, and in which FIG. 1A is a layout diagram of the integrated circuit device, FIG. 1B is a cross-sectional view of the integrated circuit device taken along line B-B' of FIG. 1A; FIG. 1C is a cross-sectional view of the integrated circuit device taken along line C-C' of FIG. 1A, and FIG. 1D is a partially cut-away perspective view of major elements of the integrated circuit device illustrated in FIG. 1C;

FIGS. 2A through 15B illustrate a method of manufacturing an integrated circuit device, according to the inventive concept, and in which FIGS. 2A, 3A, 4A, 5A, 6A, 7A, 8A, 9A, 10A, 11A, 12A, 13A, 14A and 15A are cross-sectional views the integrated circuit device during the course of its manufacture as taken in the direction of line B-B' of FIG. 1A, FIGS. 2B, 3B, 4B, 5B, 6B, 7B, 8B, 9B, 10B, 11B, 12B, 13B, 14B and 15B are cross-sectional views of the integrated circuit device during the course of its manufacture as taken in the direction of line C-C' of FIG. 1A;

DETAILED DESCRIPTION

Figure 1A:
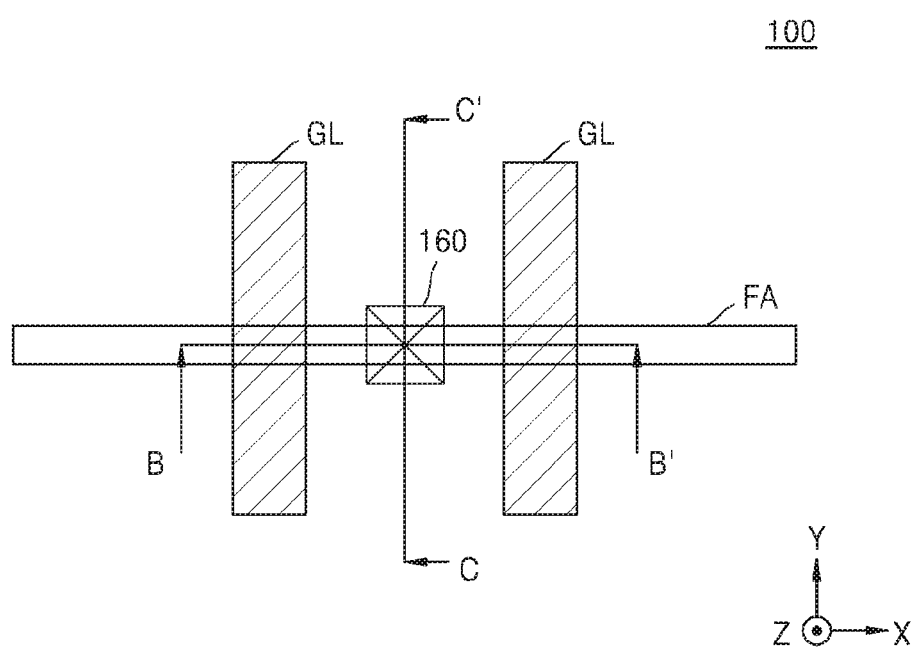

Hereinafter, examples of the inventive concept will be described more fully with reference to the accompanying drawings. In the drawings, like elements are labeled like reference numerals and repeated description thereof will be omitted.

This inventive concept may, however, be practiced in many different forms and should not be construed as limited to the examples described herein. Rather, these examples are provided so that this disclosure will be thorough and complete, and will fully convey the scope of the inventive concept to those of ordinary skill in the art.

In the present description, terms such as 'first', 'second', etc. are used to describe various members, areas, layers, regions, and/or components. However, it is obvious that the members, areas, layers, regions, and/or components should not be defined by these terms. The terms should not be construed as indicating any particular order or whether an element is at the upper or lower side or superior or inferior, and are used only for distinguishing one member, area, layer, region, or component from another member, area, layer, region, or component. Thus, a first member, area, layer, region, or component which will be described may also refer to a second member, area, layer, region, or component, without departing from the teaching of the inventive concept. For example, without departing from the scope of the inventive concept, a first component may be referred to as a second component, and similarly, a second component may be referred to as a first component.

Unless defined differently, all terms used in the description including technical and scientific terms have the same meaning as generally understood by those skilled in the art. Terms that are commonly used and defined in a dictionary should be construed as having the same meaning as in an associated technical context, and unless defined apparently in the description, the terms are not ideally or excessively construed as having formal meaning. For example, the terms "sides" or "side surfaces" of an element do not necessarily infer that the element has a plurality of sides meeting at edges or corners but merely is used to distinguish a vertical portion of the element from say its bottom surface and so may refer to an element having a circular or oval horizontal cross section. The term "extending" will generally reference a lengthwise or longitudinal direction of an element, especially a line-shaped element.

Other terminology used herein for the purpose of describing particular examples of the inventive concept is also to be taken in context. For example, the terms "comprises" or "comprising" when used in this specification specifies the presence of stated features or processes but does not preclude the presence or additional features or processes.

When an example is implementable in another manner, a predetermined process order may be different from a described one. For example, two processes that are consecutively described may be substantially simultaneously performed or may be performed in an opposite order to the described order.

In the drawings, for example, according to the manufacturing techniques and/or tolerances, shapes of the illustrated elements may be modified. Thus, the inventive concept should not be construed as being limited to the examples illustrated herein, and should include, for example, variations in the shapes caused during manufacture. As used herein, the term "and/or" includes any and all combinations of one or more of the associated listed items. Expressions such as "at least one of," when preceding a list of elements, modify the entire list of elements and do not modify the individual elements of the list.

An integrated circuit device 100 according to the inventive concept will now be described in detail with reference to FIGS. 1A through 1D.

The integrated circuit device 100 includes a substrate 110 having a fin-type active region FA extending in a first direction (X direction). The bottom BL of the fin-type active region FA is indicated with a dashed line in FIG. 1B.

The substrate 110 may include a semiconductor such as Si or Ge or a compound semiconductor such as SiGe, SiC, GaAs, InAs, or InP. As another example, the substrate 110 may have a silicon on insulator (SOI) structure. The substrate 110 may include a conductive region such as an impurity-doped well or an impurity-doped structure.

Side surfaces of a bottom portion of the fin-type active region FA are covered by a device isolation layer 112 on the substrate 110, and the fin-type active region FA protrudes from the device isolation layer 112 in a direction (Z direction) perpendicular to a main surface of the substrate 10 (X-Y plane).

A plurality of interface layers 116, a plurality of gate dielectric layers 118, and a plurality of gate lines GL extend on the fin-type active region FA of the substrate 110 in a second direction (Y direction) across the first direction (X direction).

The plurality of gate dielectric layers 118 and the plurality of gate lines GL may cover a top surface and side surfaces of the fin-type active region FA and a top surface of the device isolation layer 112. A plurality of MOS transistors may be formed at points where the fin-type active region FA and the plurality of gate lines GL cross each other. The plurality of MOS transistors may be three-dimensional MOS transistors having a channel that is formed along the top surface and the two side surfaces of the fin-type active regions FA.

Two side surfaces of each of the plurality of interface layers 116, the plurality of gate dielectric layers 118, and the plurality of gate lines GL are covered by an insulation spacer 124.

The plurality of interface layers 116 may be produced by oxidizing an exposed surface of the fin-type active region FA, and may prevent interface defects between the fin-type active region FA and the gate dielectric layer 118. Each of the plurality of interface layers 116 may comprise a low-k dielectric material having a permittivity of 9 or less, e.g., a silicon oxide layer, a silicon oxynitride layer, or a combination thereof. Alternatively, the plurality of interface layers 116 may be formed of silicate or a combination of silicate and at least one of the aforementioned silicon oxide layer and silicon oxynitride layer.

Each of the plurality of gate dielectric layers 118 may be a silicon oxide layer, a high-k dielectric layer, or a combination thereof. The high-k dielectric layer has a higher permittivity than a silicon oxide layer. For example, the gate dielectric layers 118 may have a permittivity of about 10 to about 25. The high-k dielectric layer may be of at least one material selected from the group consisting of hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but is not limited thereto. The gate dielectric layers 118 may be formed using an atomic layer deposition (ALD) method, a chemical vapor deposition (CVD) method, or a physical vapor deposition (PVD) method.

The plurality of gate lines GL extend on the gate dielectric layers 118 in a direction across the fin-type active regions FA while covering the top surfaces and two side surfaces of the fin-type active regions FA.

Each gate line GL may include a first metal-containing layer MGA and a second metal-containing layer MGB. The first metal-containing layer MGA may adjust a work function. The second metal-containing layer MGB may fill space formed in the first metal-containing layer MGA. The first metal-containing layer MGA may include at least one of TiN, TaN, TiC, and TaC. The second metal-containing layer MGB may comprise W or Al.

Alternatively, the gate line GL may have a structure in which a metal nitride layer, a metal layer, a conductive capping layer, and a gap-fill metal layer are sequentially stacked. The metal nitride layer and the metal layer may both include at least one metal selected from the group consisting of Ti, W, Ru, Nb, Mo, Hf, Ni, Co, Pt, Yb, Tb, Dy, Er, and Pd. The metal nitride layer and the metal layer may be formed using an ALD method, a metal organic ALD (MOALD) method, or a metal organic CVD (MOCVD) method. The conductive capping layer may function as a protection layer preventing oxidation of a surface of the metal layer. Also, the conductive capping layer may function as an adhesive layer (wetting layer) that facilitates deposition when another conductive layer is deposited on the metal layer. The conductive capping layer may comprise a metal nitride such as TiN, TaN, or a combination thereof, but is not limited thereto. The gap-fill metal layer may extend on the conductive capping layer. The gap-fill metal layer may be a W layer. The gap-fill metal layer may be formed using an ALD, CVD, or PVD method. The gap-fill metal layer may be buried in a recess, in an upper surface of the conductive capping layer, so that a void is not left in the capping layer.

Source/drain regions 120 are formed in the fin-type active region FA at both sides of the gate lines GL. The source/drain regions 120 may include a semiconductor layer that is epitaxially grown from the fin-type active regions FA. Each of the source/drain regions 120 has a top surface 120T in which a recess 120R is formed.

The source/drain regions 120 may have an embedded SiGe structure including a plurality of epitaxially grown SiGe layers. The plurality of SiGe layers may have different Ge contents from one another.

In other examples, the source/drain regions 120 are an epitaxially grown Si layer or an epitaxially grown SiC layer.

An inter-gate insulation layer 132 is interposed between the gate lines GL. The inter-gate insulation layer 132 may be formed to cover the source/drain regions 120 between each two adjacent gate lines GL. The inter-gate insulation layer 132 may be a silicon oxide layer, but is not limited thereto.

A blocking insulation layer 134 is formed on the plurality of gate lines GL and the inter-gate insulation layer 132. The blocking insulation layer 134 prevents penetration of undesired foreign substances, such as oxygen, into the plurality of gate lines GL so as to prevent an undesired change in a threshold voltage in the gate lines GL or a short circuit that may otherwise occur between the gate lines GL and a contact plug 160. By forming the blocking insulation layer 134, a threshold voltage may be maintained constant in the gate lines GL, and deterioration of electrical characteristics of a transistor including the gate lines GL may be prevented. The blocking insulation layer 134 may comprise silicon and nitrogen. For example, the blocking insulation layer 134 may comprise a silicon nitride layer ($Si_3N_4$), a silicon oxynitride layer (SiON), a carbon-containing silicon oxynitride layer (SiCON), or a combination thereof. The blocking insulation layer 134 may have a thickness of about 20 Å to about 50 Å.

An interlayer insulation layer 136 is formed on the blocking insulation layer 134. The interlayer insulation layer 136 may be a silicon oxide layer, but is not limited thereto.

At least one of the inter-gate insulation layer 132 and the interlayer insulation layer 136 may be a tetraethyl orthosilicate (TEOS) layer. Alternatively, at least one of the inter-gate insulation layer 132 and the interlayer insulation layer 136 may comprise an ultra low-K (ULK) layer having an ultra low dielectric constant K of about 2.2 to about 2.4, e.g., at least one of an SiOC layer and an SiCOH layer.

The contact plug 160 extends on the source/drain regions 120 from an inner portion of the recess 120R in a third direction (Z direction) perpendicular to the main surface (X-Y plane) of the substrate 110. The contact plug 160 may pass through the interlayer insulation layer 136, the blocking insulation layer 134, and the inter-gate insulation layer 132 and be electrically connected to the source/drain regions 120.

The contact plug 160 may be surrounded by the inter-gate insulation layer 132, the blocking insulation layer 134, and the interlayer insulation layer 136 to be insulated from other nearby conductive layers. The contact plug 160 may be formed of W, Cu, Al, an alloy thereof, or a combination thereof, but the inventive concept is not limited to the above-described materials.

A metal silicide layer 140 is interposed between the source/drain regions 120 and the contact plug 160. The metal silicide layer 140 lines the recess 120R, i.e., extends along surfaces defining the recess 120R.

A bottom surface and side surfaces of the contact plug 160 are surrounded by a conductive barrier layer 150. The conductive barrier layer 150 includes a lower barrier layer 150L facing the metal silicide layer 140 and an upper barrier layer 150U surrounding the side surfaces of the contact plug 160 on the lower barrier layer 150L.

A metal layer 130, formed of the same metal as that constituting the metal silicide layer 140, may be interposed between the metal silicide layer 140 and the lower barrier layer 150L. For example, when the metal silicide layer 140 is of a titanium silicide, the metal layer 130 is of titanium. In some examples, the metal layer 130 is omitted. In these examples, the metal silicide layer 140 and the lower barrier layer 150L may contact each other.

The conductive barrier layer 150 may comprise a conductive metal nitride layer. For example, the conductive barrier layer 150 may be formed of TiN, TaN, AlN, WN, or a combination thereof.

The metal silicide layer 140 includes a first portion 140A having a first thickness TH1 and covering the bottom surface of the contact plug 160 and a second portion 140B that is integral with the first portion 140A, has a second thickness TH2 that is different from the first thickness TH1, and covers the side surfaces of the contact plug 160. The second thickness TH2 may be less than the first thickness TH1. In particular, the thickness TH2 of the second portion 140B of the metal silicide layer 140 in the first direction (X direction) may be less than the thickness TH1 of the first portion 140A of the metal silicide layer 140 in the third direction (Z direction). Alternatively, the second thickness TH2 may be approximately the same as the first thickness TH1.

The second portion 140B of the metal silicide layer 140 may have a ring shape surrounding the side surfaces of the contact plug 160. For example, the shape of the contact plug 160 in the X-Y plane may be a circle, an oval, or a polygon. The second portion 140B of the metal silicide layer 140 may also have a circular, oval, or polygonal cross section in the X-Y plane similar to the cross-sectional shape of the contact plug 160.

The second portion 140B of the metal silicide layer 140 may have a thickness that decreases away from the substrate 110.

The metal silicide layer 140 may include a dopant. The dopant may include at least one element selected from carbon group elements and inactive elements.

For example, the metal silicide layer 140 may have a composition represented by MSixDy, wherein M is a metal, D is an element different from M and Si, $0<x\leq3$, and $0<y\leq1$. More specifically, M may be Ti, W, Ru, Nb, Mo, Hf, Ni, Co, Pt, Yb, Tb, Dy, Er, or Pd, and D may be Ge, C, Ar, Kr, or Xe.

A topmost surface 140T of the metal silicide layer 140 that is the farthest away from the substrate 110 may be lie in the same plane as an uppermost or top surface 120T of the source/drain region 120 that is the farthest away from the substrate 110.

The source/drain region 120 may have a raised source/drain (RSD) structure in which the top surface 120T of the source/drain region 120 is higher than a top surface FT of the fin-type active region FA. Also, the second portion 140B of the metal silicide layer 140 may protrude from the top surface FT of the fin-type active region FA away from the substrate 110.

The source/drain region 120 may include a crystalline semiconductor region 120A and a local amorphous semiconductor region 120B. The local amorphous semiconductor region 120B may be interposed between the metal silicide layer 140 and the crystalline semiconductor region 120A. The local amorphous semiconductor region 120B may be interposed between the first portion 140A of the metal silicide layer 140 and the crystalline semiconductor region 120A. In other examples, the local amorphous semiconductor region 120B is interposed between the first portion 140A of the metal silicide layer 140 and the crystalline semiconductor region 120A and between the second portion 140B of the metal silicide layer 140 and the crystalline semiconductor region 120A.

The first portion 140A of the metal silicide layer 140 may be at a higher level than a lowermost surface GLB of the gate lines GL (see FIG. 1D) and at a lower level than the top surface FT of the fin-type active region FA. That is, the first portion 140A of the metal silicide layer 140 may be situated at a level between the lowermost surface GLB of the gate lines GL (see FIG. 1D) and the top surface FT of the fin-type active region FA.

The contact plug 160 may have a first height H1 with respect to the bottom of the recess 120R in the source/drain region 120, i.e., may have a dimension H1 in the third direction (Z direction), and the second portion 140B of the metal silicide layer 140 may have a second height H2 with respect to the bottom of the recess 120R in the source/drain region 120. The first height H1 may be at least four times the second height H2, but is not limited thereto.

The integrated circuit device 100 illustrated in FIGS. 1A through 1D includes the metal silicide layer 140 lining the bottom and the sides of the recess 120R in the source/drain region 120. As the metal silicide layer 140 is formed to extend over a relatively broad area from the bottom to the sides of the recess 120R, a contact area between the source/drain regions 120 and the contact plug 160 may be increased. Accordingly, a contact resistance between the source/drain region 120 and the contact plug 160 may be improved.

A method of manufacturing an integrated circuit device, according to the inventive concept, will now be described with reference to FIGS. 2A through 15B.

Figure 2A:
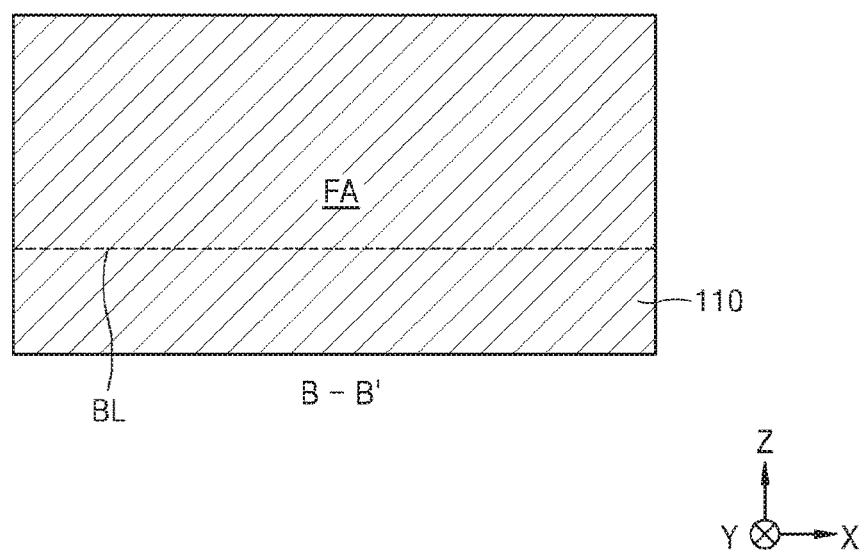
Figure 2B:
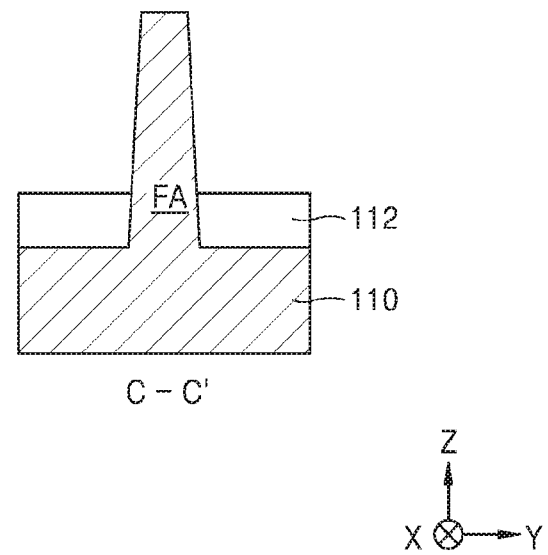

Referring first to FIGS. 2A and 2B, a substrate 110 is prepared.

The substrate 110 may have a predetermined MOS region. For example, the substrate 110 may have a PMOS region or an NMOS region.

A portion of the substrate 110 is etched to form a fin-type active region FA protruding upwardly (in a Z direction) from a main surface of the substrate 110 (X-Y plane) and extending lengthwise in a predetermined direction (e.g., X direction).

Note, here, portions of the substrate 110 illustrated in FIGS. 2A and 2B may be used to form a PMOS transistor or an NMOS transistor. To either of these ends, the fin-type active region FA may include P-type or N-type impurity diffusion regions (not shown) according to a channel-type of a MOS transistor that is to be constituted by the fin-type active region FA.

Next, an insulation layer is formed on the substrate 110, thus covering the fin-type active region FA, and the insulation layer is etched back to form a device isolation layer 112. The fin-type active region FA protrudes from a top surface of the device isolation layer 112 to be exposed.

The device isolation layer 112 may be formed as a silicon oxide layer, a silicon nitride layer, a silicon oxynitride layer, or a combination thereof. The device isolation layer 112 may include an insulation liner (not shown) formed as a thermal oxide layer and a buried insulation layer (not shown) formed on the insulation liner.

Figure 3A:
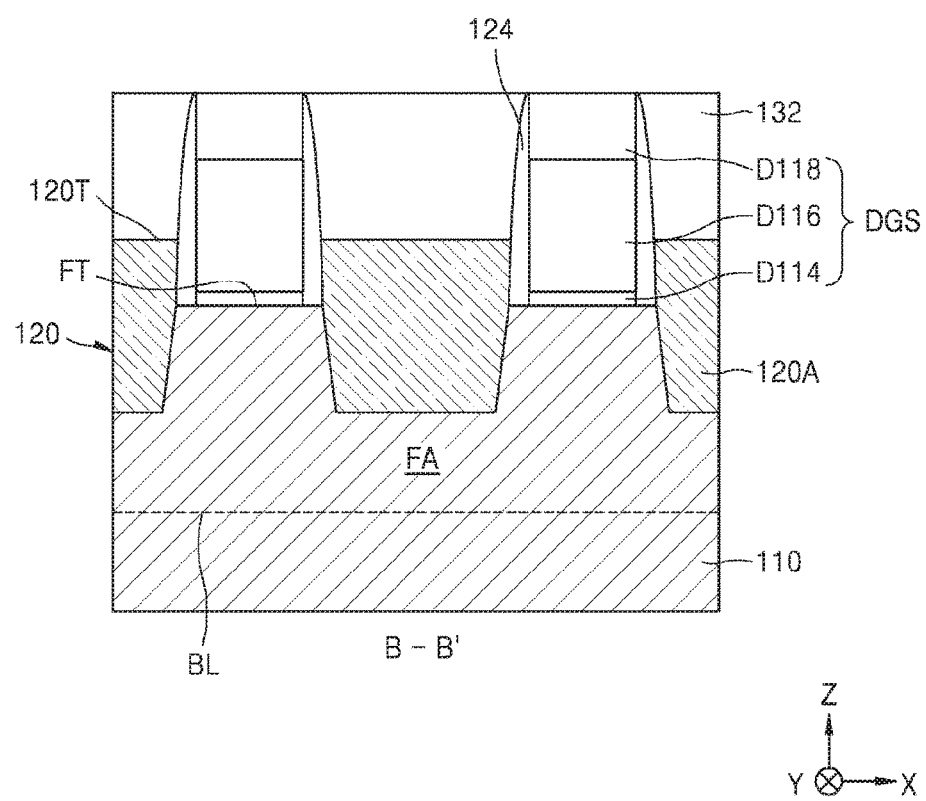
Figure 3B:
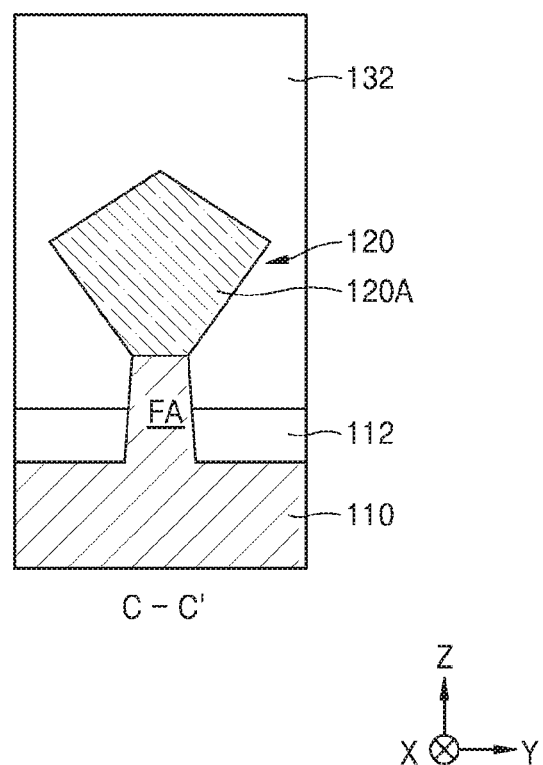

Referring to FIGS. 3A and 3B, a plurality of dummy gate structures DGS are formed on the fin-type active region FA across the fin-type active region FA.

The plurality of dummy gate structures DGS may each include a dummy gate dielectric layer D114, a dummy gate line D116, and a dummy gate capping layer D118 that are sequentially stacked on the fin-type active region FA. The dummy gate dielectric layer D114 may be a silicon oxide layer. The dummy gate line D116 may comprise polysilicon. The dummy gate capping layer D118 may comprise at least one of a silicon oxide, a silicon nitride, and a silicon oxynitride.

Next, an insulation spacer 124 is formed on the two side surfaces of the dummy gate structures DGS. The insulation spacer 124 may be formed of a silicon nitride, a silicon oxynitride, or a combination thereof.

Next, a semiconductor layer is formed on the fin-type active region FA that is exposed on the two sides of the dummy gate structures DGS by using an epitaxial growth process to form a source/drain region 120 including a crystalline semiconductor region 120A.

The source/drain region 120 may have a top surface 120T at a higher level than a top surface FT of the fin-type active region FA.

Note, the cross section of the source/drain region 120 is not limited to that illustrated in FIGS. 3A and 3B. For example, the source/drain region 120 may have a cross section, namely a shape in the Y-Z plane, that is polygonal (e.g., square, pentagonal, or hexagonal), circular, or oval.

The source/drain region 120 may be formed as a semiconductor layer doped with an impurity. The source/drain region 120 may be formed of Si, SiGe, or SiC doped with an impurity.

An inter-gate insulation layer 132 is formed to cover the source/drain region 120, the plurality of dummy gate structures DGS, and the insulation spacer 124.

In one example of this method, to form the inter-gate insulation layer 132, an insulation layer having a sufficient thickness to cover the source/drain region 120, the plurality of dummy gate structures DGS, and the insulation spacer 124 is formed. Then, the resultant product on which the insulation layer is formed is planarized so that the plurality of dummy gate structures DGS are exposed, thereby forming the inter-gate insulation layer 132 having a planar top surface.

Figure 4A:
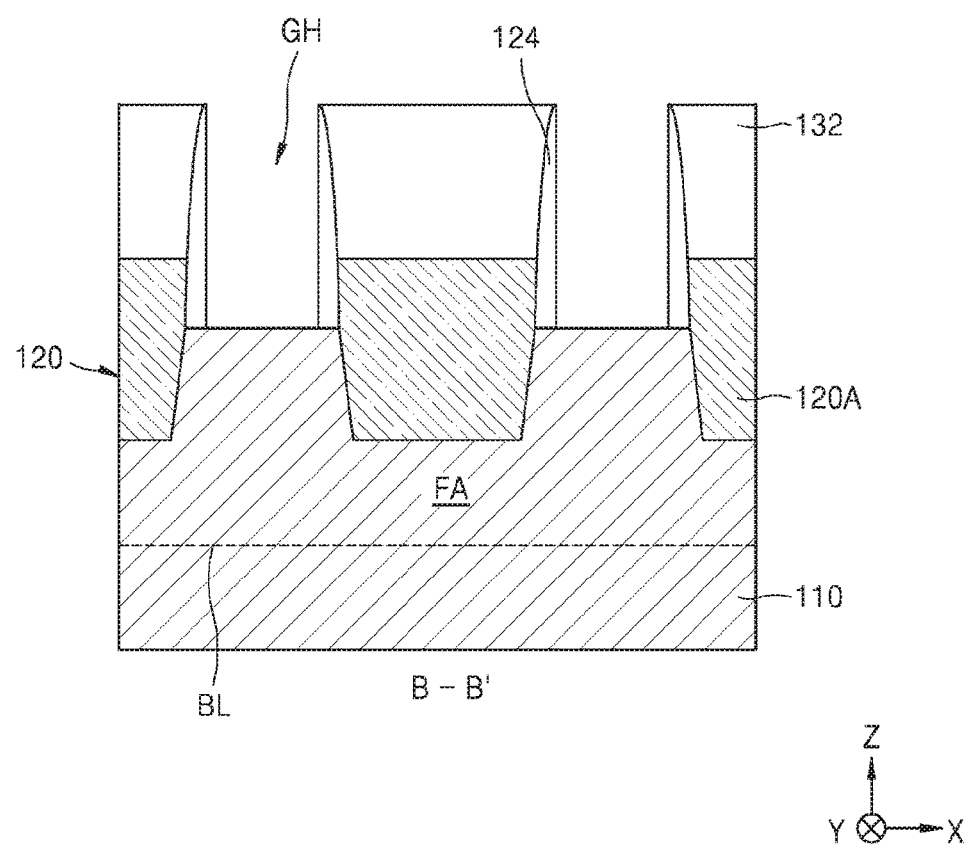
Figure 4B:
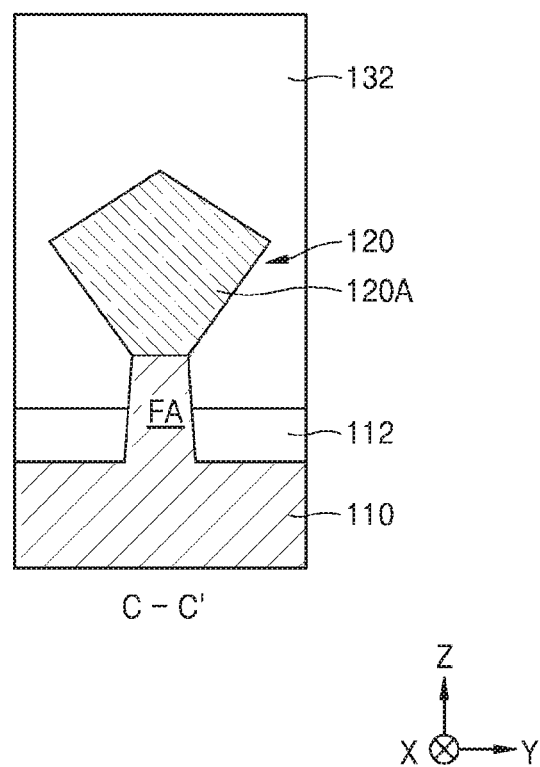

Referring to FIGS. 4A and 4B, the dummy gate structures DGS exposed through the inter-gate insulation layer 132 may be removed to form a plurality of gate spaces GH.

The insulation spacer 124 and the fin-type active region FA may be exposed through the plurality of gate spaces GH.

Figure 5A:
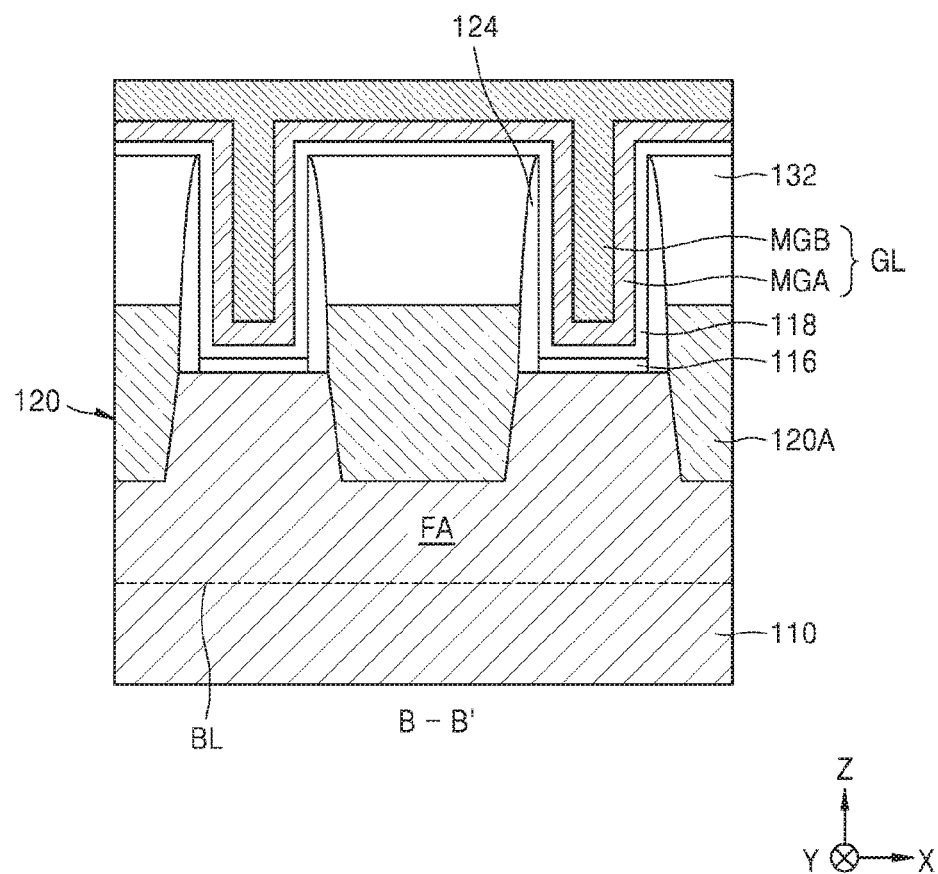
Figure 5B:
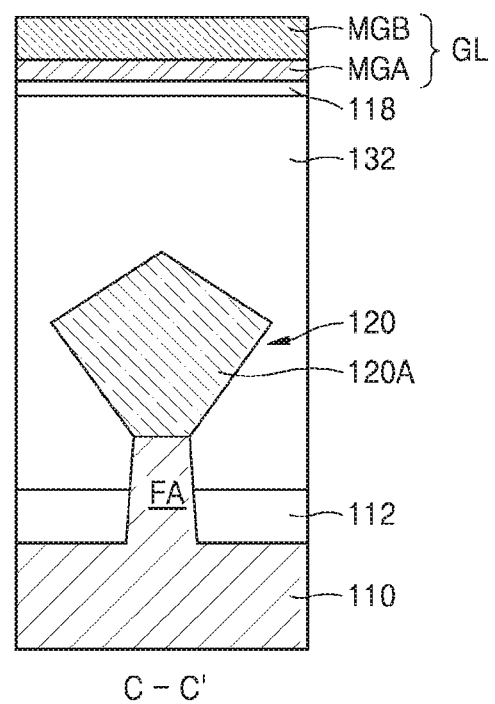

Referring to FIGS. 5A and 5B, a plurality of interface layers 116, a gate dielectric layer 118, and a gate line GL are sequentially formed in the plurality of gate spaces GH (see FIG. 4A).

The interface layers 116 may be formed by a process of oxidizing a portion of the fin-type active region FA exposed in the plurality of gate spaces GH (see FIG. 4A). The plurality of interface layers 116 may prevent interface defects between a plurality of gate dielectric layers 118 formed on the interface layers 116 and the fin-type active region FA formed under the interface layers 116. The plurality of interface layers 116 may be formed as a silicon oxide layer, a silicon oxynitride layer, a silicate layer, or a combination thereof.

The gate dielectric layer 118 and the gate line GL may be formed to fill the plurality of gate spaces GH (see FIG. 4A) and cover the top surface of the inter-gate insulation layer 132.

The gate dielectric layer 118 may be formed as a silicon oxide layer, a high-k dielectric layer, or a combination thereof. The high-k dielectric layer may be formed of a material having a dielectric constant greater than that of a silicon oxide layer. For example, the gate dielectric layer 118 may have a dielectric constant of about 10 to about 25.

The gate line GL may include a first metal-containing layer MGA and a second metal-containing layer MGB. The first metal-containing layer MGA may adjust a work function. The second metal-containing layer MGB may fill space formed by the first metal-containing layer MGA. The first metal-containing layer MGA may comprise at least one of Ti, TaN, TiC, and TaC. The second metal-containing layer MGB may comprise W or Al.

In another example, the gate line GL may be formed by sequentially forming a metal nitride layer, a metal layer, a conductive capping layer, and a gap-fill metal layer in the foregoing order on one another. The metal nitride layer and the metal layer may each include at least one metal selected from the group consisting of Ti, W, Ru, Nb, Mo, Hf, Ni, Co, Pt, Yb, Tb, Dy, Er, and Pd. The metal nitride layer and the metal layer may be formed using an ALD method, a MOALD method or a MOCVD method. The conductive capping layer may function as a protection layer preventing oxidization of a surface of the metal layer. Also, the conductive capping layer may function as an adhesive layer (wetting layer) that facilitates deposition of another conductive layer on the metal layer. The conductive capping layer may be formed of a metal nitride such as TiN, TaN, or a combination thereof, but is not limited thereto. The gap-fill metal layer may fill spaces between the fin-type active regions FA and extend on the conductive capping layer. The gap-fill metal layer may be formed as a W layer. The gap-fill metal layer may be formed by an ALD method, a CVD method, or a PVD method. The gap-fill metal layer may be buried in a recess, defined by a step in a top surface of the conductive capping layer, so as to prevent a void from being left in the spaces between the fin-type active regions FA.

Figure 6A:
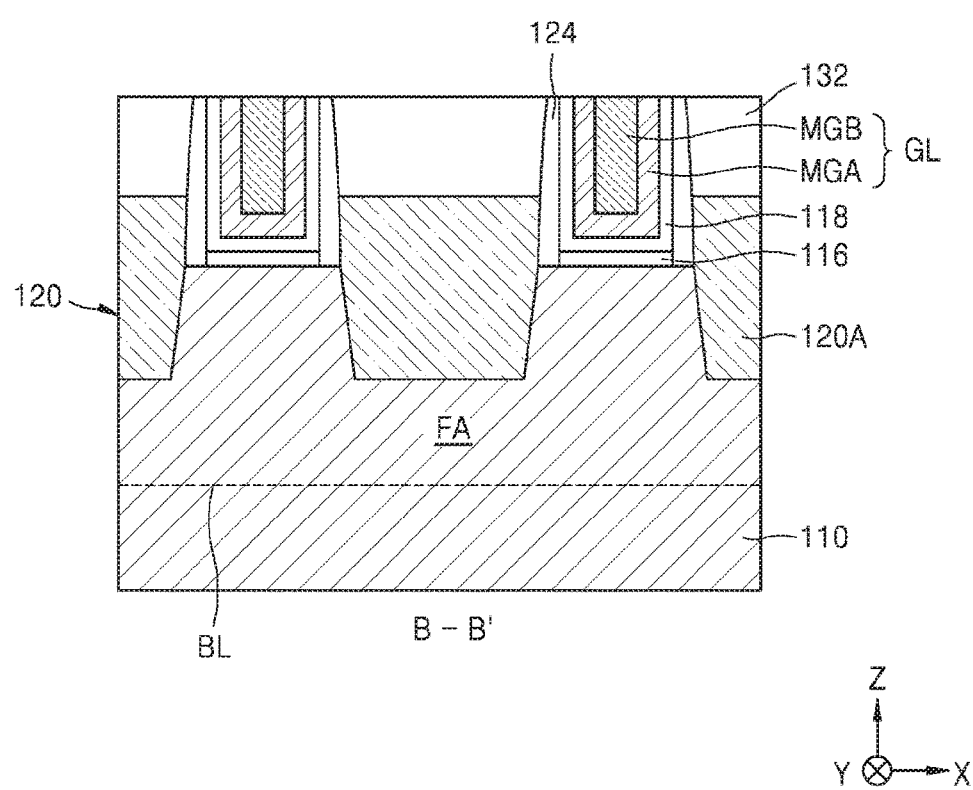
Figure 6B:
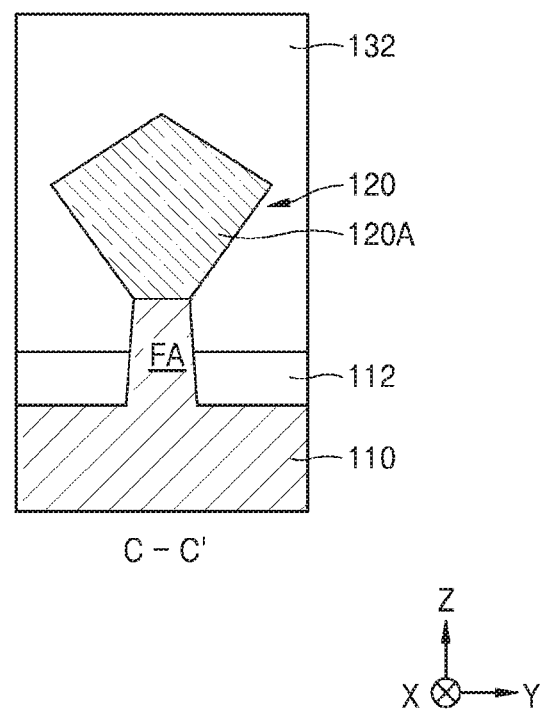

Referring to FIGS. 6A and 6B, unnecessary portions of the resultant product illustrated in FIGS. 5A and 5B are removed by a planarization process to thereby separate the gate line GL into a plurality of gate lines GL and the gate dielectric layer 118 into a plurality of gate dielectric layers 118 remaining in the plurality of gate spaces GH (see FIG. 4A).

As a result of the planarization process, predetermined amounts of the insulation spacer 124 and the inter-gate insulation layer 132 are consumed from the top surfaces thereof so that the thicknesses of the insulation spacer 124 and the inter-gate insulation layer 132 may be reduced in a Z direction. That is, the thicknesses of the insulation spacer 124 and the inter-gate insulation layer 132 may be reduced, and top surfaces of the plurality of gate dielectric layers 118, top surfaces of the plurality of insulation spacers 124, and top surfaces of the inter-gate insulation layer 132 may be exposed around top surfaces of the plurality of gate lines GL.

Figure 7A:
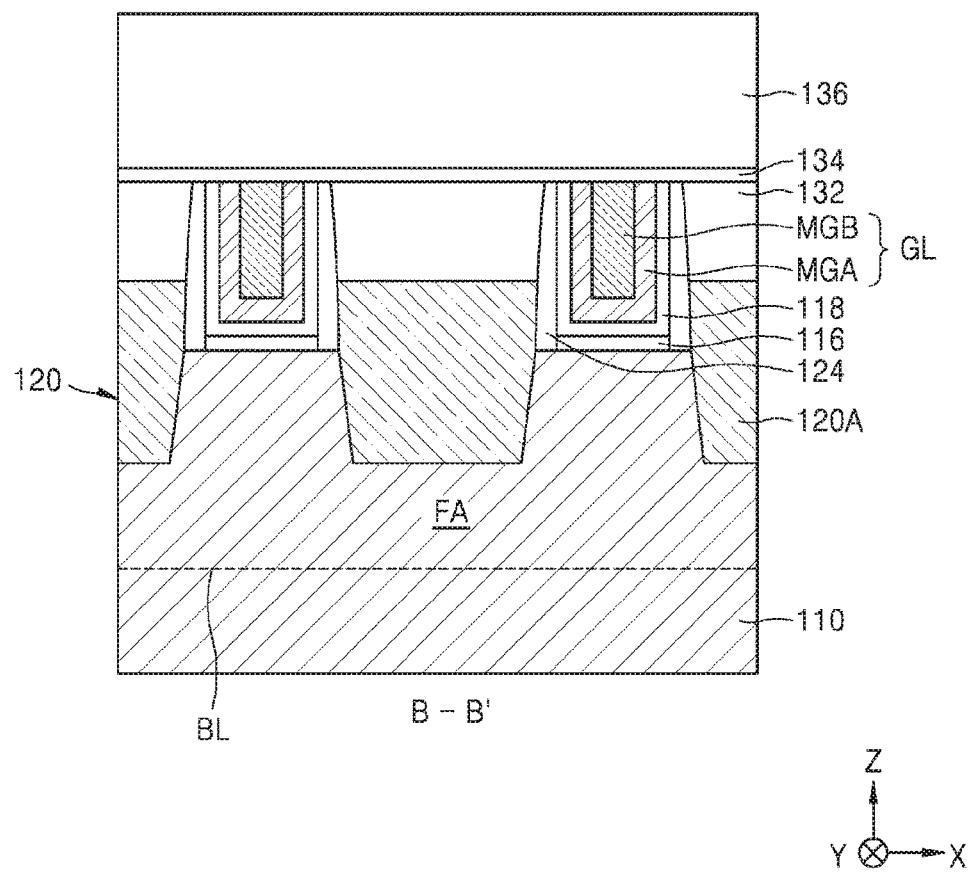
Figure 7B:
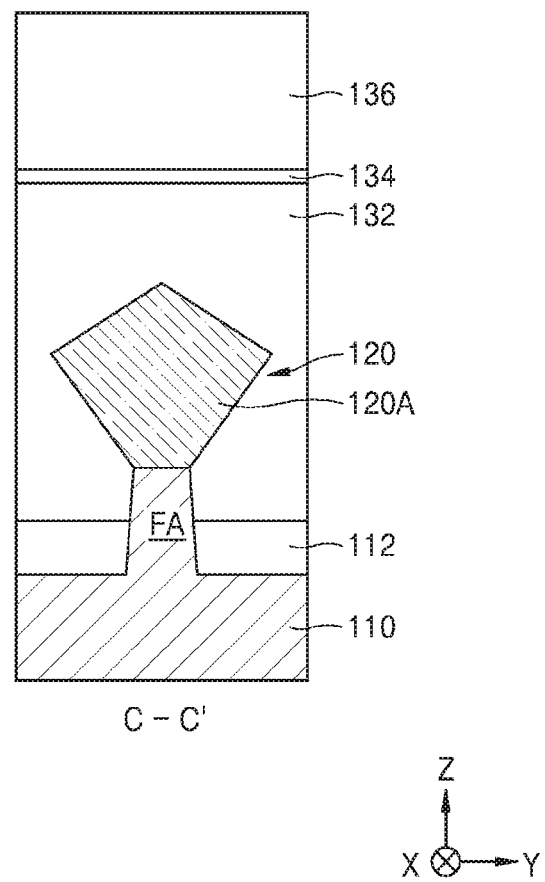

Referring to FIGS. 7A and 7B, a blocking insulation layer 134 and an interlayer insulation layer 136 are sequentially formed on the plurality of gate lines GL and the inter-gate insulation layer 132. The interlayer insulation layer 136 may have a planarized top surface. Although the blocking insulation layer 134 of this example is a flat layer covering the top surfaces of the plurality of gate lines GL, the inventive concept is not limited thereto. Rather, for example, the blocking insulation layer 134 may be formed to cover the top surfaces of the gate lines GL and at least a portion of the two side surfaces of the gate lines GL, and a step may be formed in at least a portion of the blocking insulation layer 134 according to the underlying structure.

Figure 8A:
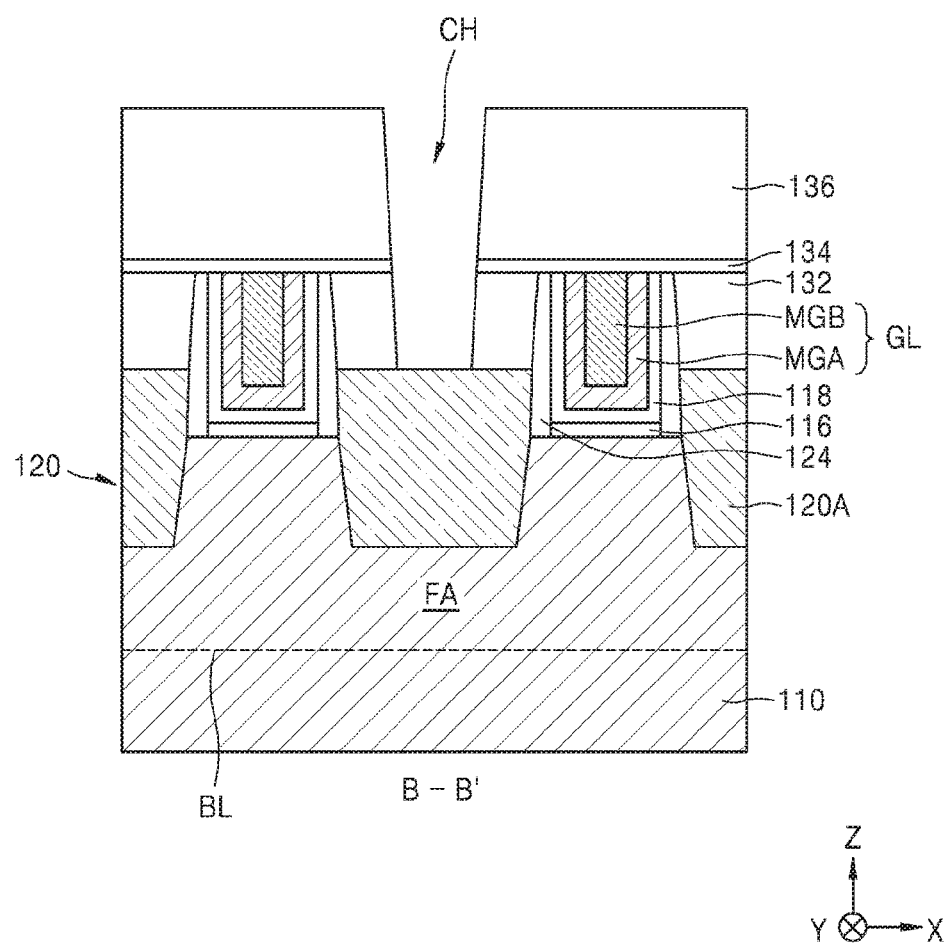
Figure 8B:
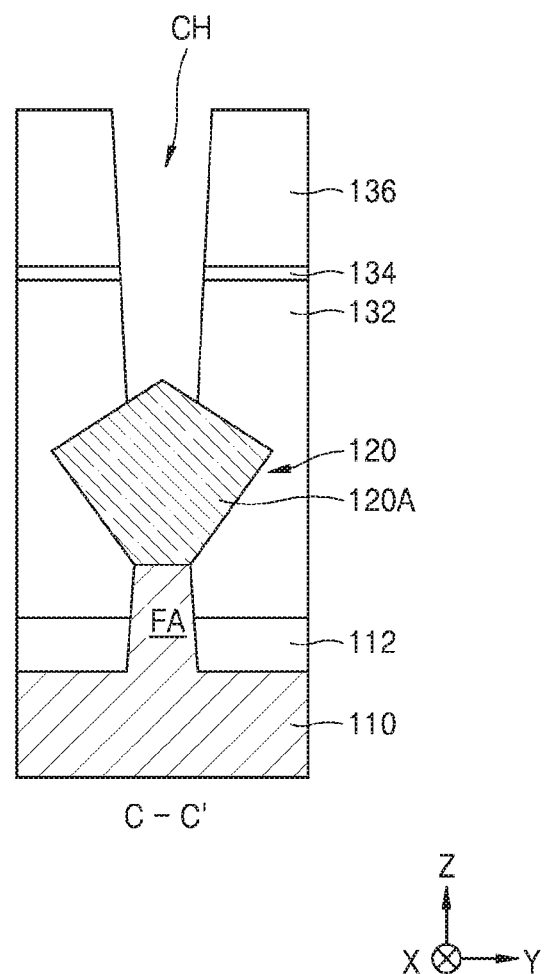

Referring to FIGS. 8A and 8B, a mask pattern (not shown) is formed on the interlayer insulation layer 136, and then the interlayer insulation layer 136, the blocking insulation layer 134, and the inter-gate insulation layer 132 are sequentially etched by using the mask pattern as an etching mask, thereby forming a contact hole CH passing through the interlayer insulation layer 136, the blocking insulation layer 134, and the inter-gate insulation layer 132.

The source/drain region 120 may be exposed through the contact hole CH.

Figure 9A:
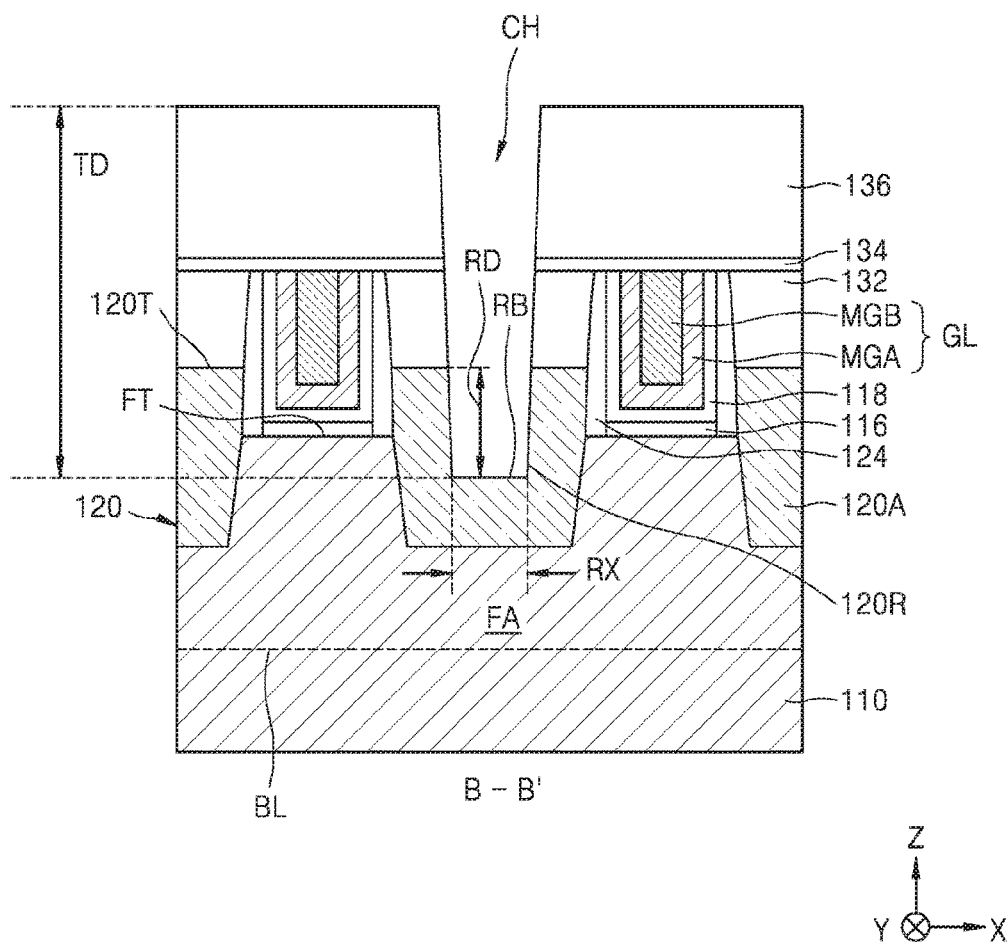
Figure 9B:
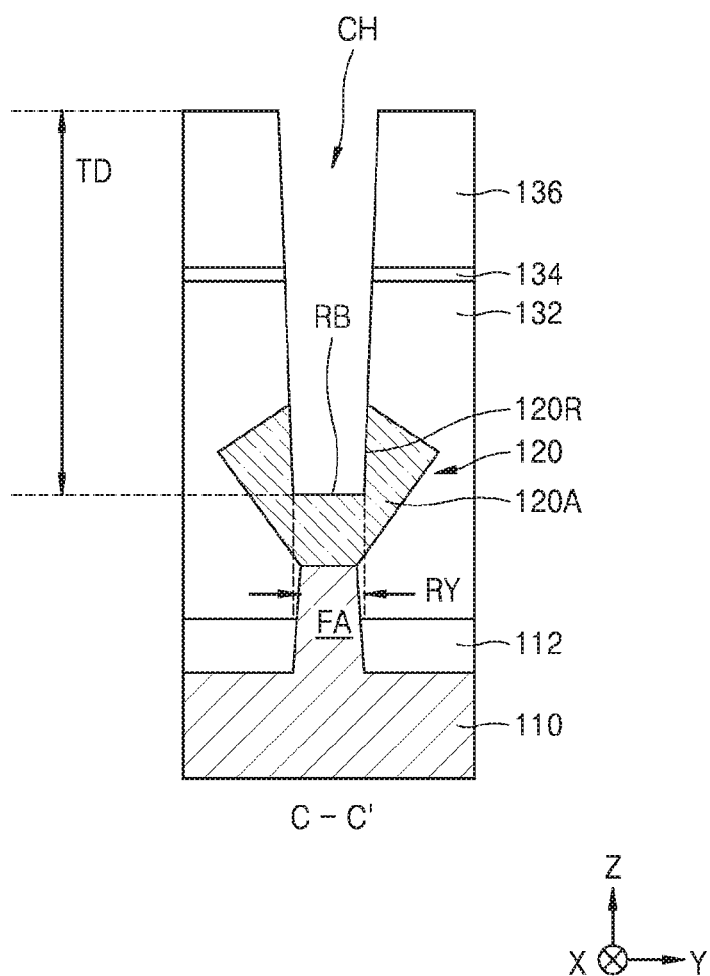

Referring to FIGS. 9A and 9B, a portion of the exposed portion of the source/drain region 120 is removed by introducing an etchant through the contact hole CH, thereby forming a recess 120R in the top surface 120T of the source/drain region 120.

The recess 120R may thus be contiguous with the contact hole CH. When forming the recess 120R, the depth RD of the recess 120R may be controlled by the etching process such that the recess 120R has a bottom surface RB that is at a lower level than the top surface FT of the fin-type active region FA.

An aspect ratio of a hole that is constituted by the recess 120R and the contact hole may be at least 2 and is preferably about 4 or more. For example, a total depth TD, which is a sum of depths of the recess 120R and the contact hole CH along the Z direction, may be at least twice, and preferably about 4 times or more, the width RX of the bottom RB of the recess 120R in an X direction and/or the width RY of the recess 120R along a Y direction, but the inventive concept is not limited thereto.

Figure 10A:
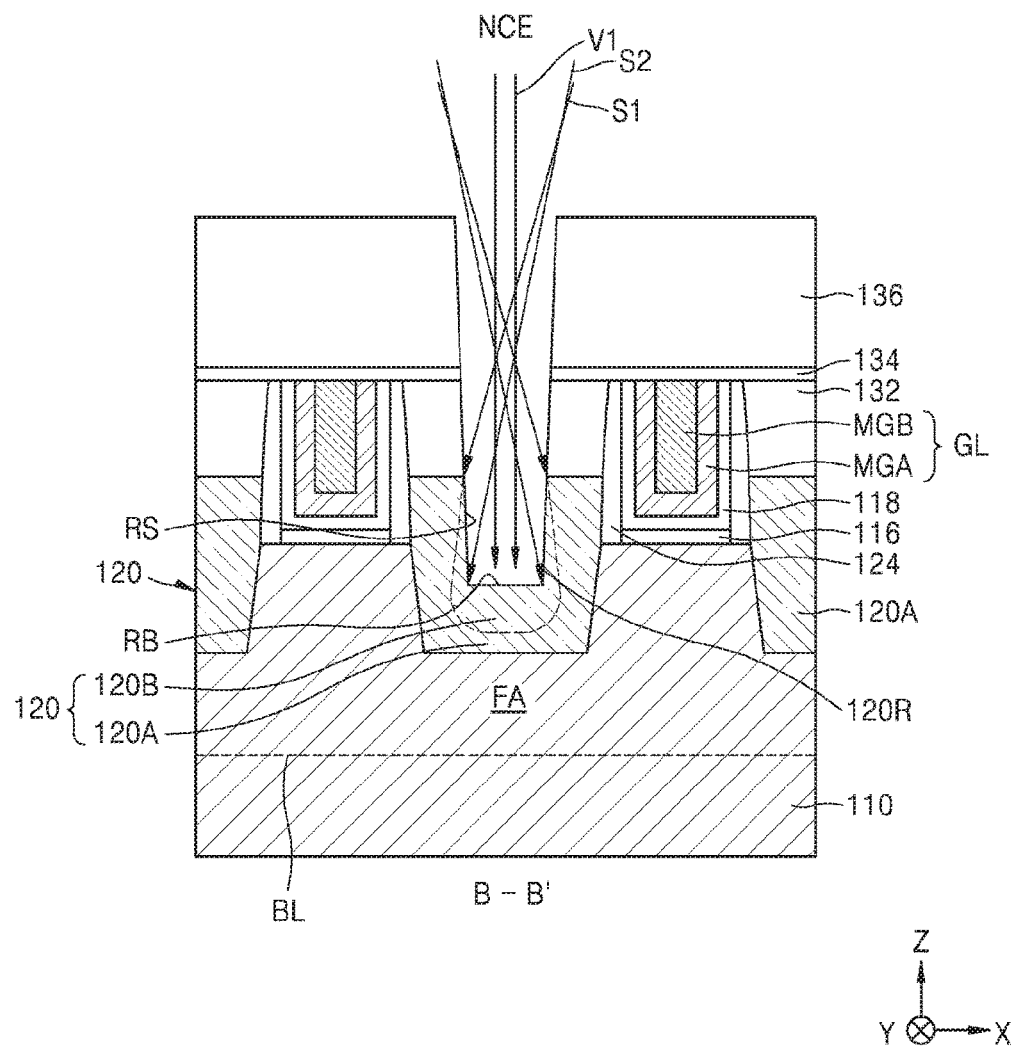
Figure 10B:
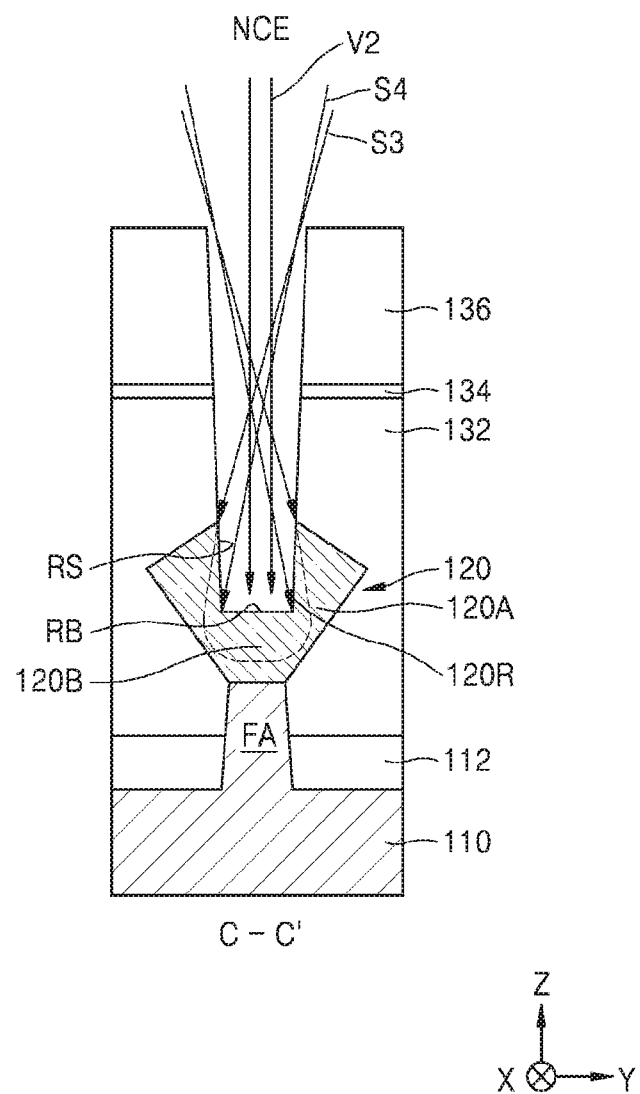

Referring to FIGS. 10A and 10B, a portion of the source/drain region 120, from the bottom RB and sides RS of the recess 120R, is amorphousized through the contact hole CH to form an amorphous source/drain region 120B.

For example, amorphousization element ions NCE may be injected into the source/drain region 120 through the bottom RB and the sides RS of the recess 120R.

When forming the local amorphous semiconductor region 120B by injecting the amorphousization element ions NCE into the source/drain region 120, an inclined injection method may be used so that the amorphousization element ions NCE are injected into the source/drain region 120 not only through the bottom RB of the recess 120R but also through the sides RS of the recess 120R. In the inclined injection method, the amorphousization element ions NCE may be injected not only in a direction (Z direction) perpendicular to the main surface of the substrate 110 (X-Y plane) as denoted, for example, by arrows V1 and V2 in FIGS. 10A and 10B, but also in an inclined direction as denoted by arrows S1, S2, S3, and S4 in FIGS. 10A and 1B.

The inclination angle between the perpendicular direction and the inclined direction with respect to the main surface of the substrate 110 (X-Y plane) may be greater than 0 degrees and equal to or less than 70 degrees. However, this method according to the inventive concept is not limited to this range of inclination angles; rather, the inclination angle may be set based on an aspect ratio of the hole formed by the recess 120R and the contact hole CH.

The amorphousization element ions NCE may a dopant of at least one ion selected from the group consisting of Ge, Si, C, Ar, Kr, and Xe ions, but the inventive concept is not limited thereto.

The injection method of the amorphousization element ions NCE may be performed using an ion injection energy of about 10 to about 35 KeV, e.g., an ion injection energy of about 10 to about 15 KeV, but is not limited thereto. Also, an ion injection dose may be about 1E14 to about 5E15 atom/cm$^2$ to prevent activation of the injected amorphousization element ions NCE, but the method is not limited to injecting the ions within such a range of dosages.

The density of the amorphousization element ions NCE injected into the local amorphous semiconductor region 120B may be uniform over the entire amorphous source/drain region 120B. Alternatively, the density of the amorphousization element ions NCE injected into the local amorphous semiconductor region 120B may vary across the amorphous source/drain region 120B. For example, the density of the amorphousization element ions NCE may increase in directions toward the bottom RB and the sides RS of the recess 120R in the local amorphous semiconductor region 120B. Alternatively, the density of the amorphousization element ions NCE may decrease in directions toward the bottom RB and the sides RS of the recess 120R.

Furthermore, the injection method of the amorphousization element ions NCE may be performed at a very low temperature of about −100° C. to about −20° C., but is not limited thereto.

The distance over which the amorphousization element ions NCE diffuse in the source/drain region 120 may be greater in a lateral direction (X direction and/or Y direction) in the source/drain region 120 than in a perpendicular direction (Z direction). Thus, a thickness (in the Z direction) of a portion of the local amorphous semiconductor region 120B exposed through the bottom RB of the recess 120R may be greater than a thickness (in the X direction and/or the Y direction) of a portion of the local amorphous semiconductor region 120B exposed through the sides RS of the recess 120R.

Figure 11A:
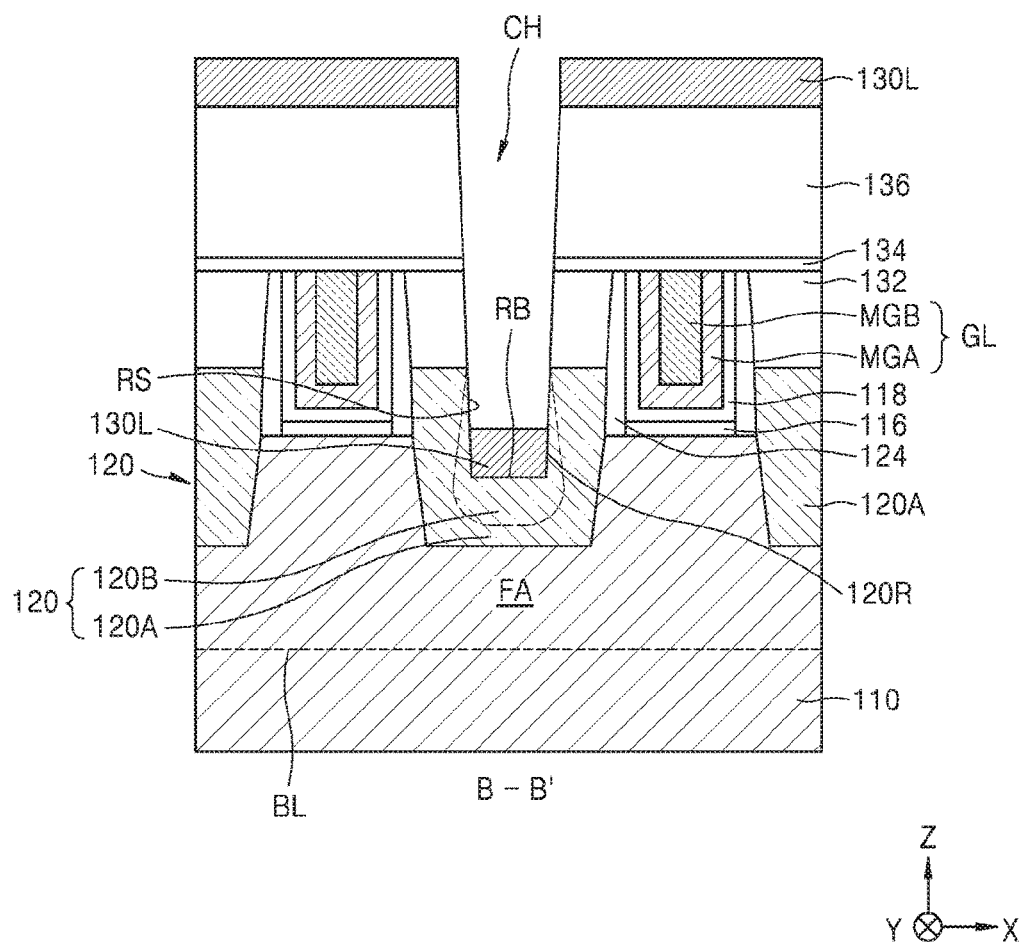
Figure 11B:
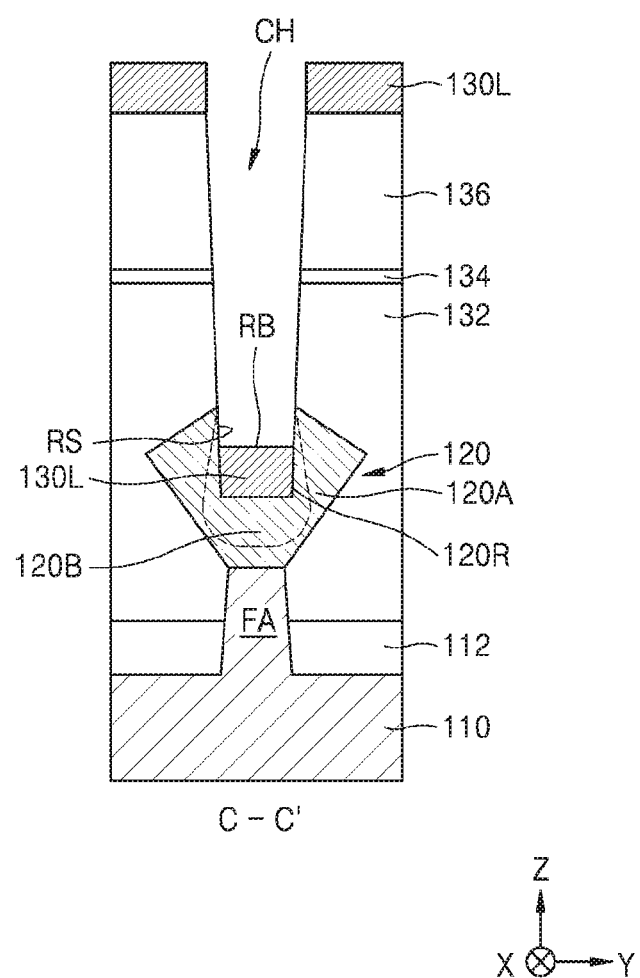

Referring to FIGS. 11A and 11B, a local metal layer 130B covering the bottom surface defining the bottom RB of the recess 120R is formed.

The local metal layer 130L may be formed of Ti, W, Ru, Nb, Mo, Hf, Ni, Co, Pt, Yb, Tb, Dy, Er, Pd, or a combination thereof.

The local metal layer 130L may be formed using a PVD method. The local metal layer 130L may be formed in the bottom RB of the recess 120R and on a top surface of the interlayer insulation layer 136. The local metal layer 130L may not be deposited along the upper parts of the sides RS of the recess 120R or sides of the contact hole CH. Accordingly, the surfaces defining the sides RS of the recess 120R above the local metal layer 130L and defining the sides of the contact hole CH may be exposed. Alternatively, only a small amount of the local metal layer 130L of an insignificant thickness may be deposited along the upper parts of the sides RS of the recess 120R and the sides of the contact hole CH The local metal layer 130L may be formed at room temperature. The local metal layer 130L may be formed in an atmosphere of about 15° C. to 40° C. Accordingly, the thermal budget of the process of forming the local metal layer 130L is minimal and as a result, contact resistance in a contact structure produced from the local metal layer 130L may be kept to a minimum.

In this example, as described above with reference to FIGS. 10A and 10B, after forming the local amorphous semiconductor region 120B, and before forming the local metal layer 130L as described above with reference to FIGS. 11A and 11B, an exposed surface of the local amorphous semiconductor region 120B may be dry cleansed to remove undesired materials such as a natural oxide layer from the exposed surface of the local amorphous semiconductor region 120B. After the dry cleaning process of the local amorphous semiconductor region 120B, the process of forming the local metal layer 130L may be performed without a vacuum break and in an in-situ manner as described with reference to FIGS. 11A and 11B.

Figure 12A:
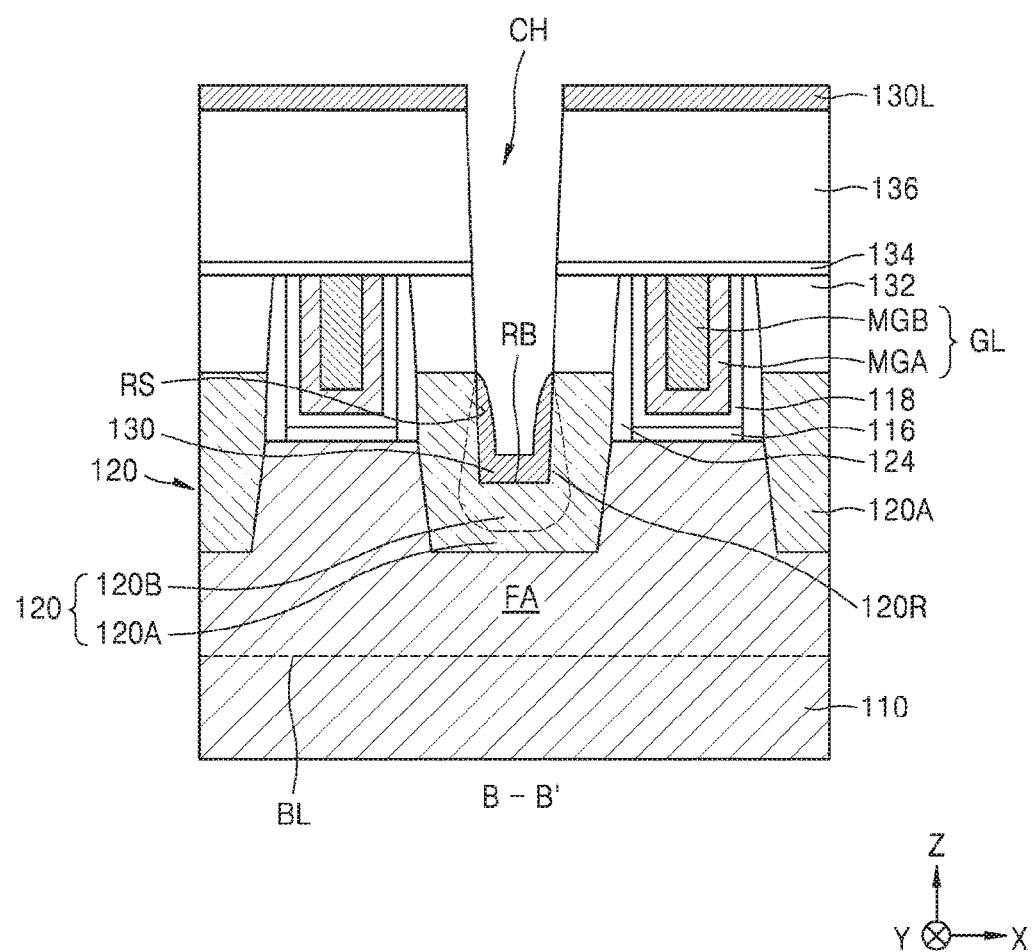
Figure 12B:
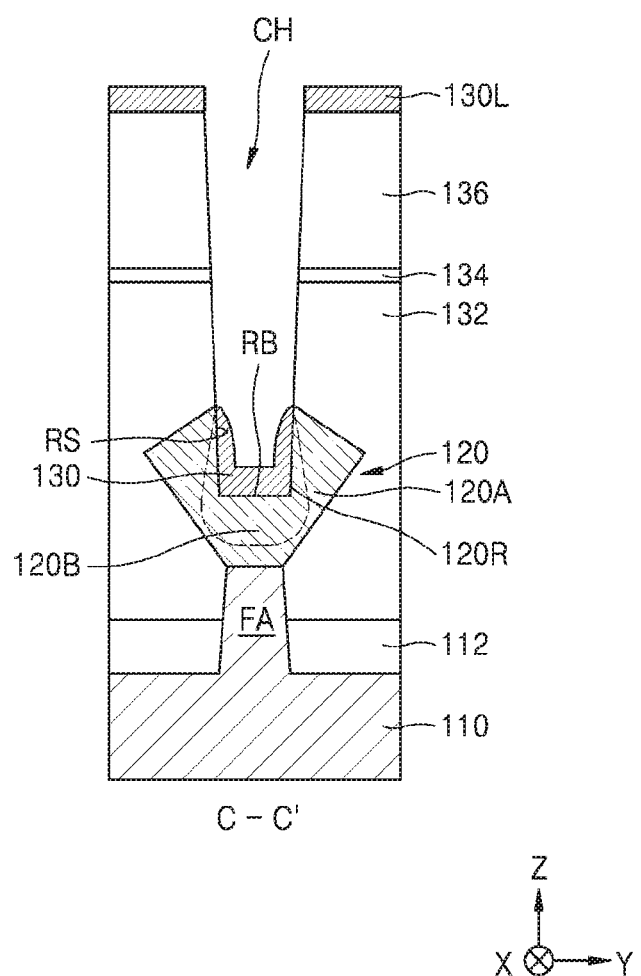

Referring to FIGS. 12A and 12B, a portion of the local metal layer 130L formed in the recess 120R may be distributed on the sides RS of the recess 120R so as to form a metal layer 130 that covers the bottom surface RB and the sides RS of the recess 120R as a liner.

In one example of this method, a re-sputtering process may be performed on the local metal layer 130L to distribute a portion of the local metal layer 130L formed in the recess 120R on the sides RS of the recess 120R. For example, an Ar sputtering process may be performed on the local metal layer 130L formed in the recess 120R.

While performing the re-sputtering process on the local metal layer 130L, foreign substances that may remain on a surface of the local metal layer 130L, such as a natural oxide layer, may be removed from the resultant product shown in FIGS. 11A and 11B.

The process of forming the local metal layer 130L described with reference to FIGS. 11A and 11B and the re-sputtering process performed on the local metal layer 130L described with reference to FIGS. 12A and 12B may be performed in an in-situ manner without vacuum break between the respective processes.

As a result of performing the re-sputtering process on the local metal layer 130L, the metal layer 130 which is of a liner form is left in the recess 120R, and a thickness of a portion of the local metal layer 130L on the top surface of the interlayer insulation layer 136 may be reduced. Thus, the metal layer 130 may have a sufficient height to completely cover the bottom BS and the sides RS of the recess 120R.

Figure 13A:
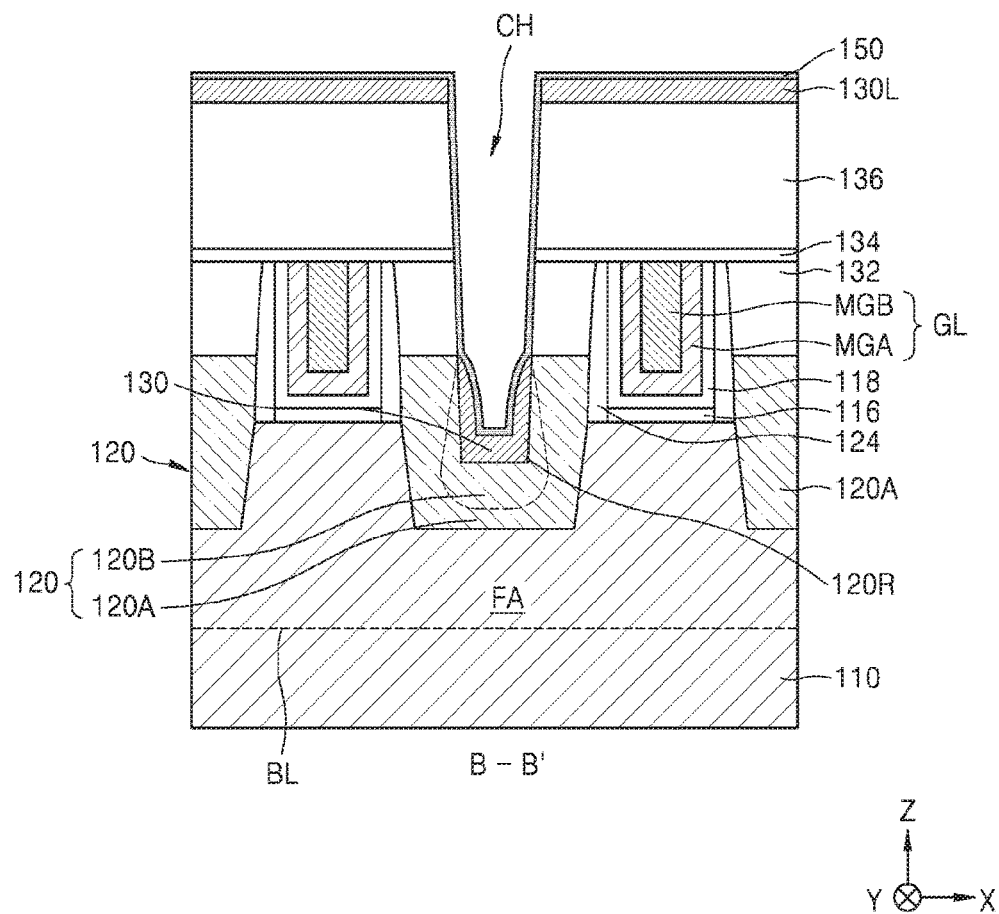
Figure 13B:
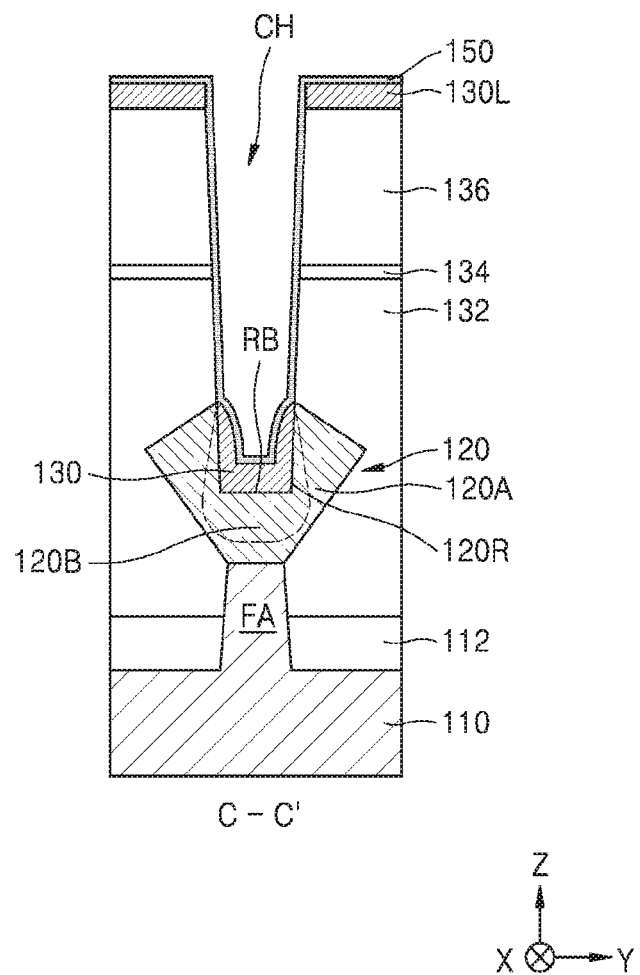

Referring to FIGS. 13A and 13B, a conductive barrier layer 150 covering an exposed surface of the metal layer 130 and sides of the contact hole CH is formed on the resultant product including the metal layer 130 in the recess 120R.

The conductive barrier layer 150 may be formed to conformally cover the exposed surface of the metal layer 130 and the surfaces defining the contact hole CH.

The conductive barrier layer 150 may comprise a conductive metal nitride layer. For example, the conductive barrier layer 150 may be formed of TiN, TaN, AlN, WN, or a combination thereof, but the inventive concept is not limited thereto.

The conductive barrier layer 150 may be formed using a PVD method, a CVD method, or an ALD method, but the inventive concept is not limited thereto.

The process of forming the local metal layer 130L described with reference to FIGS. 11A and 11B, the re-sputtering process performed on the local metal layer 130L described with reference to FIGS. 12A and 12B, and the process of forming the conductive barrier layer 150 described with reference to FIGS. 13A and 13B may be performed in an in-situ manner without vacuum break between the respective processes.

Figure 14A:
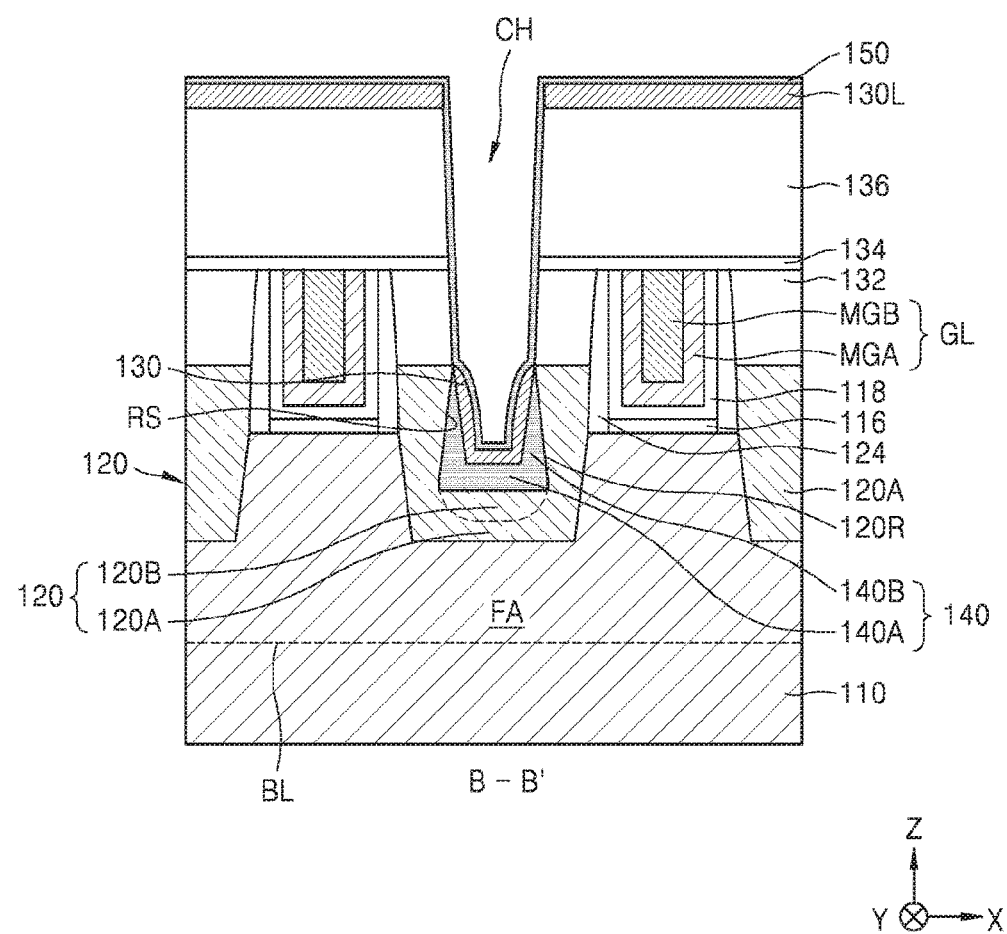
Figure 14B:
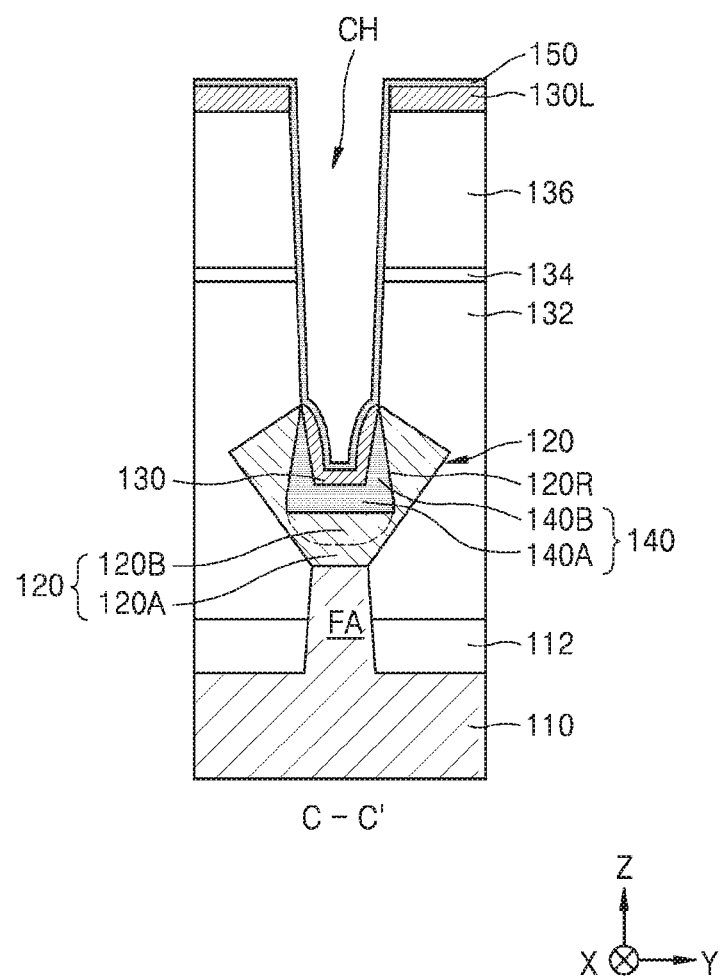

Referring to FIGS. 14A and 14B, the resultant product illustrated in FIGS. 13A and 13B, on which the metal layer 130 and the conductive barrier layer 150 covering the metal layer 130 are formed, is annealed to induce a reaction between the semiconductor material of the source/drain region 120 and the metal of the metal layer 130 to thereby form a metal silicide layer 140 covering the source/drain region 120 over the bottom RB and the sides RS of the recess 120R.

When forming the metal silicide layer 140, the local amorphous semiconductor region 120B of the source/drain region 120 and the metal layer 130 may react with each other. The entire portion of the local amorphous semiconductor region 120B that is formed along the sides RS of the recess 120R and has a relatively small thickness may be used in a silicidation reaction. On the other hand, only a portion of the local amorphous semiconductor region 120B that is formed along the bottom RB of the recess 120R and has a relatively great thickness may be used in the silicidation reaction such that some of this local amorphous semiconductor region 120B remains unreacted below the metal silicide layer 140.

The above-described annealing process to form the metal silicide layer 140 may be performed using a laser, but the inventive concept is not limited thereto.

The metal silicide layer 140 may include a first portion 140A of the thickness TH1 (see FIG. 1B) covering the source/drain region 120 at the bottom RB of the recess 120R. Also, the metal silicide layer 140 may include a second portion 140B of the second thickness TH2 (see FIG. 1B) that is integral with the first portion 140A and covers the source/drain region 120 at the sides RS of the recess 120R. The second thickness TH2 may be different from, e.g., less than the first thickness TH1. For example, the thickness TH2 in the first direction (X direction) of the second portion 140B may be less than the thickness TH1 in the third direction (Z direction) of the first portion 140A in the metal silicide layer 140. In other examples, the metal silicide layer 140 is formed such that the second thickness TH2 is substantially the same as the first thickness TH1. The second portion 140B of the metal silicide layer 140 may have a thickness that decreases in a direction away from the substrate 110.

After the metal silicide layer 140 is formed, a portion of the metal layer 130 may remain between the metal silicide layer 140 and the conductive barrier layer 150 as illustrated in FIGS. 14A and 14B. In some examples, unlike that illustrated in FIGS. 14A and 14B, the entire metal layer 130 may be used to form the metal silicide layer 140 so that none of the metal layer 130 is left between the metal silicide layer 140 and the conductive barrier layer 150. In this case, the metal silicide layer 140 and the conductive barrier layer 150 directly contact each other. This will be further described in detail with reference to FIGS. 16 and 18.

Figure 15A:
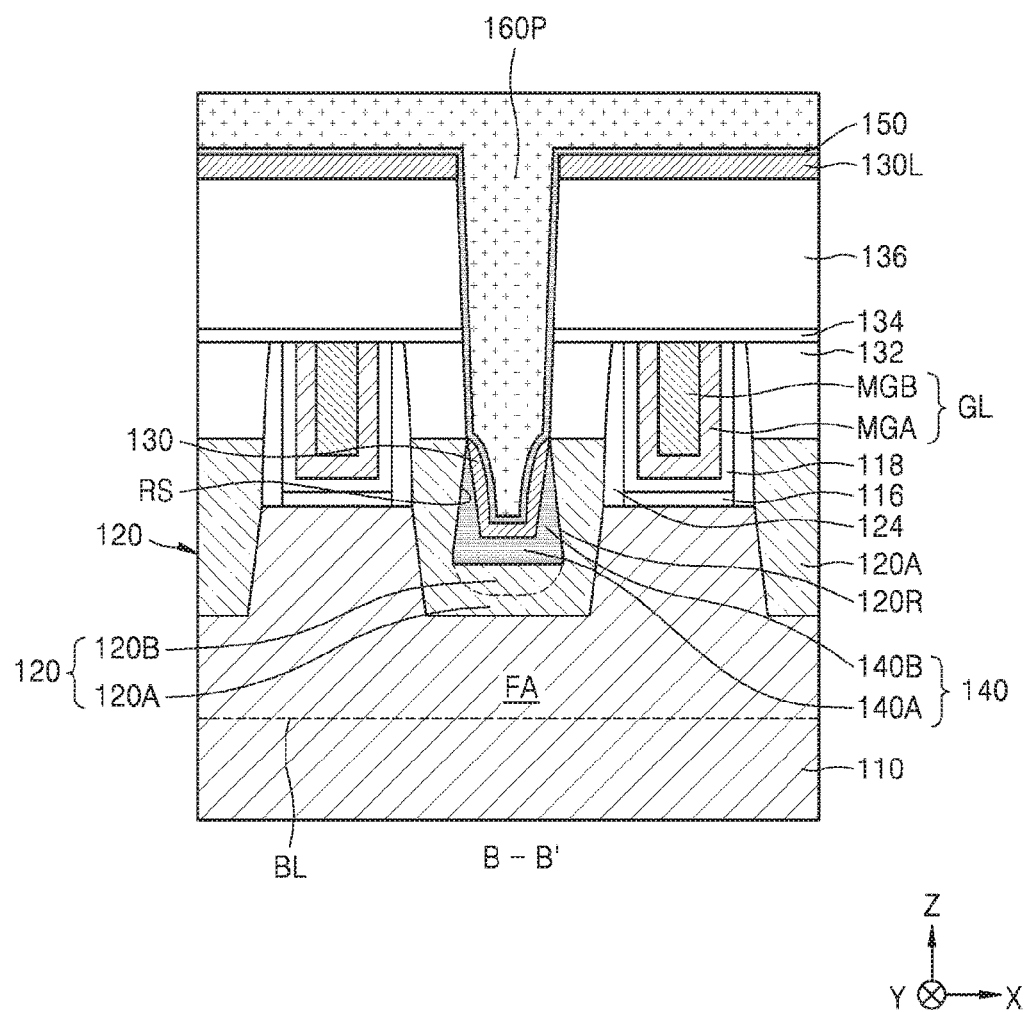
Figure 15B:
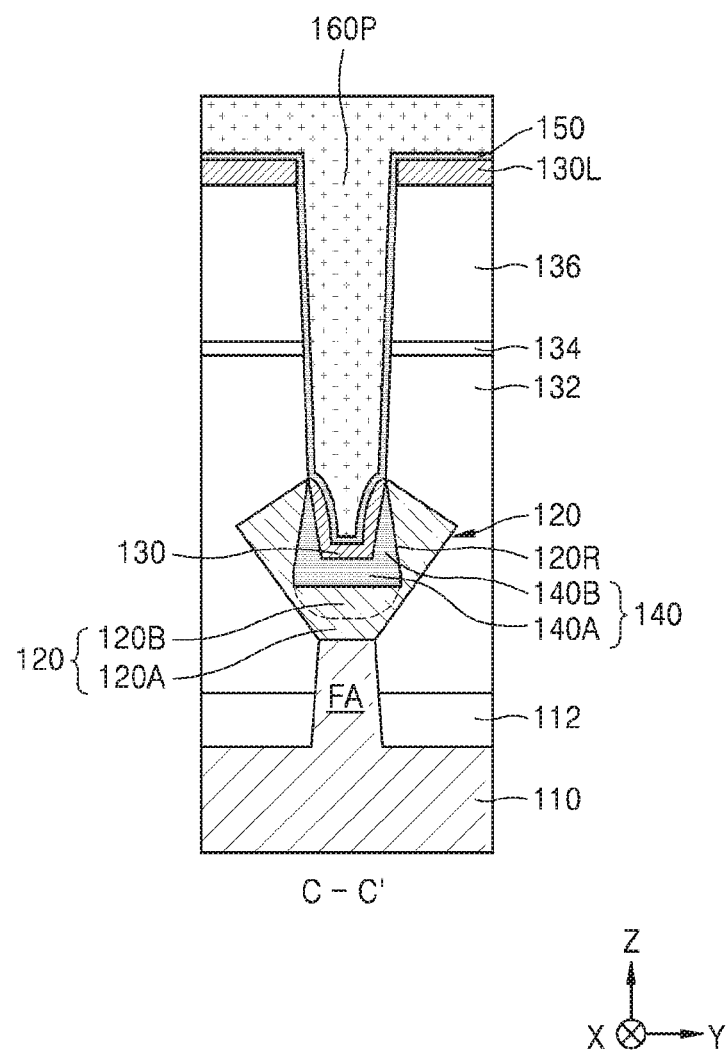

Referring to FIGS. 15A and 15B, a conductive layer 160P having a sufficient thickness to fill the contact hole CH and the recess 120R is formed on the resultant product shown in FIGS. 14A and 14B.

The conductive layer 160P may be formed of W, Cu, Al, an alloy of one of such metals, or a combination thereof.

The conductive layer 160P may be formed to fill what remains of the contact hole CH and the recess 120R and extend over the top surface of the interlayer insulation layer 136 to cover the conductive barrier layer 150. Unnecessary portions of the local metal layer 130L, the conductive barrier layer 150, and the conductive layer 160P may be removed so that the top surface of the interlayer insulation layer 136 is exposed, and the conductive barrier layer 150 and the conductive layer 160P are left only in the contact hole CH and the recess 120R. A planarization process such as a chemical mechanical polishing (CMP) process may be performed to remove the unnecessary portions of the local metal layer 130L, the conductive barrier layer 150, and the conductive layer 160P.

Figure 1B:
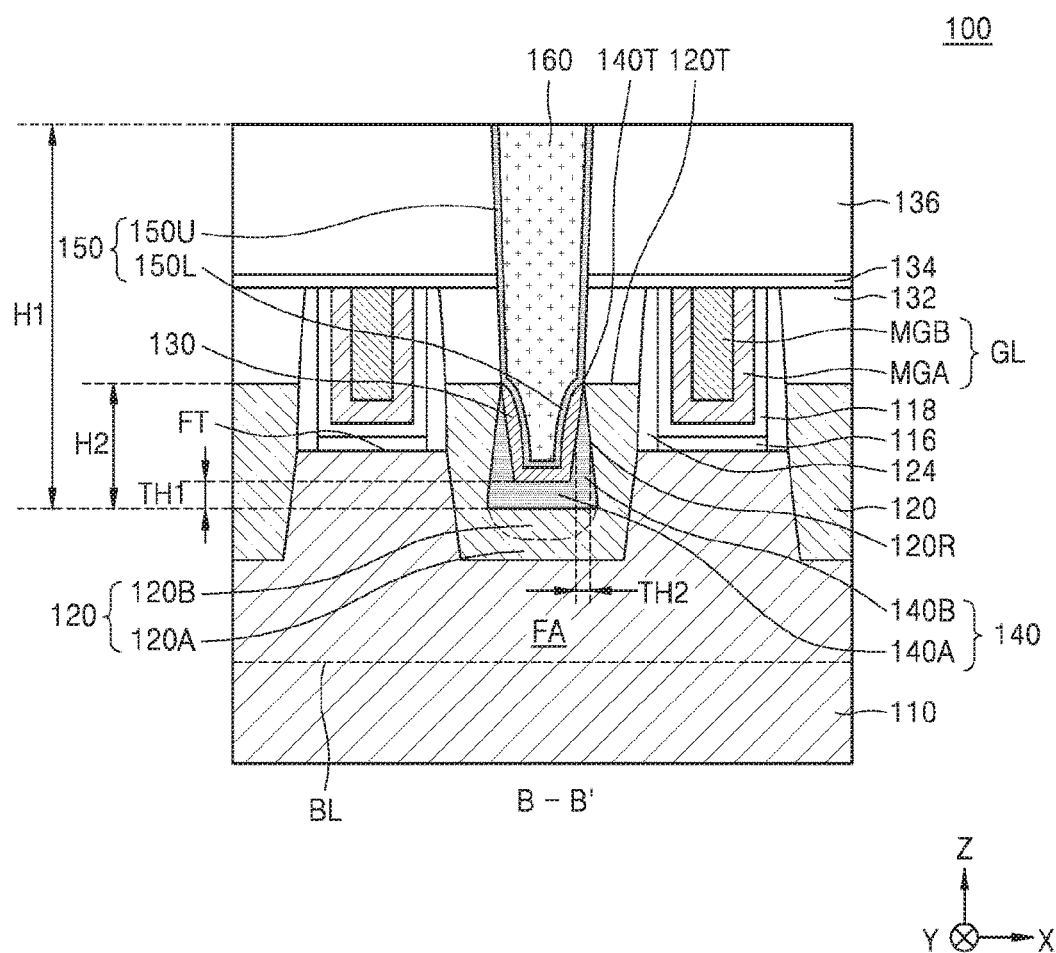
Figure 1C:
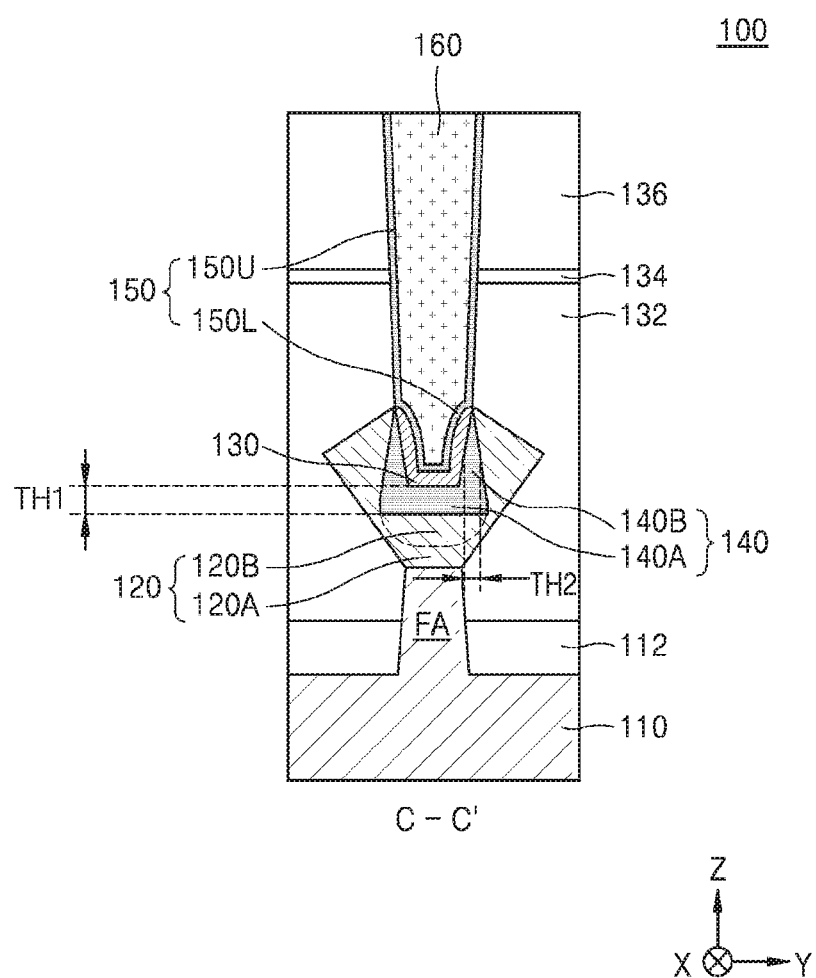
Figure 1D:
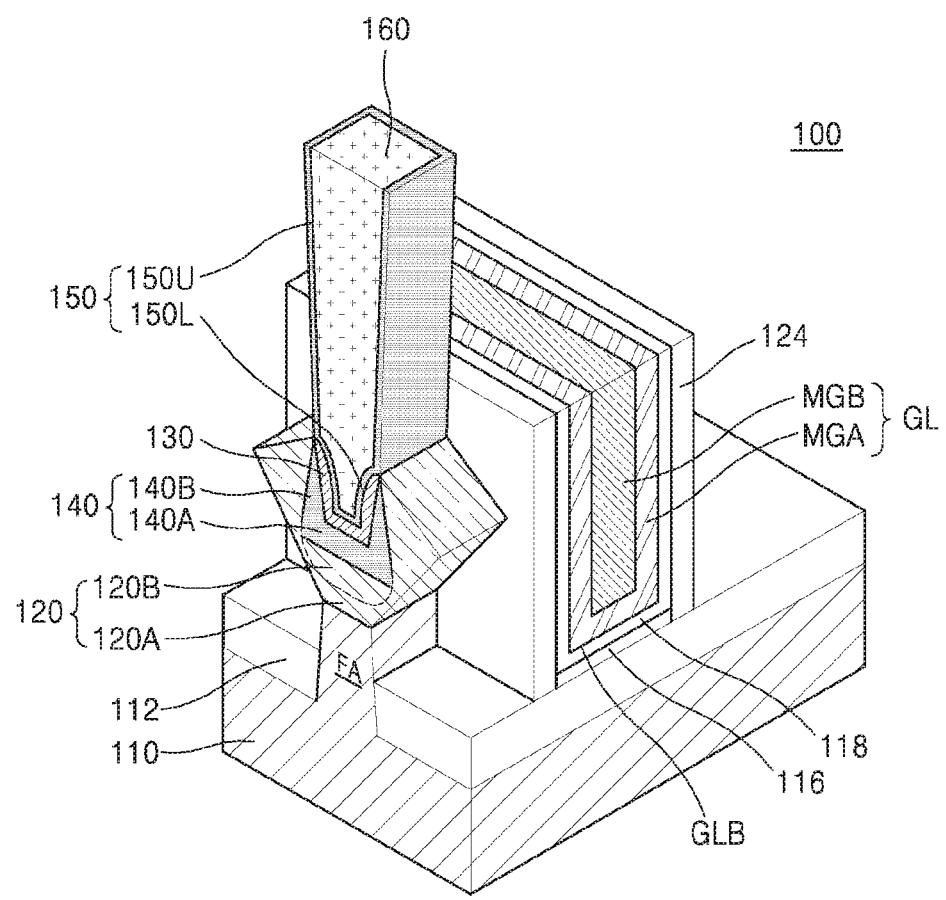

As a result, as illustrated in FIGS. 1B through 1D, the contact plug 160, which is formed of a portion of the conductive layer 160P that fills the contact hole CH and the recess 120R, and the conductive barrier layer 150 surrounding the contact plug 160 in the contact hole CH may be left.

As described with reference to FIGS. 2A through 15B, the metal silicide layer 140 covering the bottom RB and the sides RS of the recess 120R in the source/drain region 120 of the integrated circuit device 100 may be manufactured using a relatively low temperature process, for example, a PVD process that is performed at room temperature instead of a CVD process which requires a high temperature of about 400° C. or more. Thus, a contact resistance between the source/drain region 120 and the contact plug 160 may be minimized.

Figure 16:
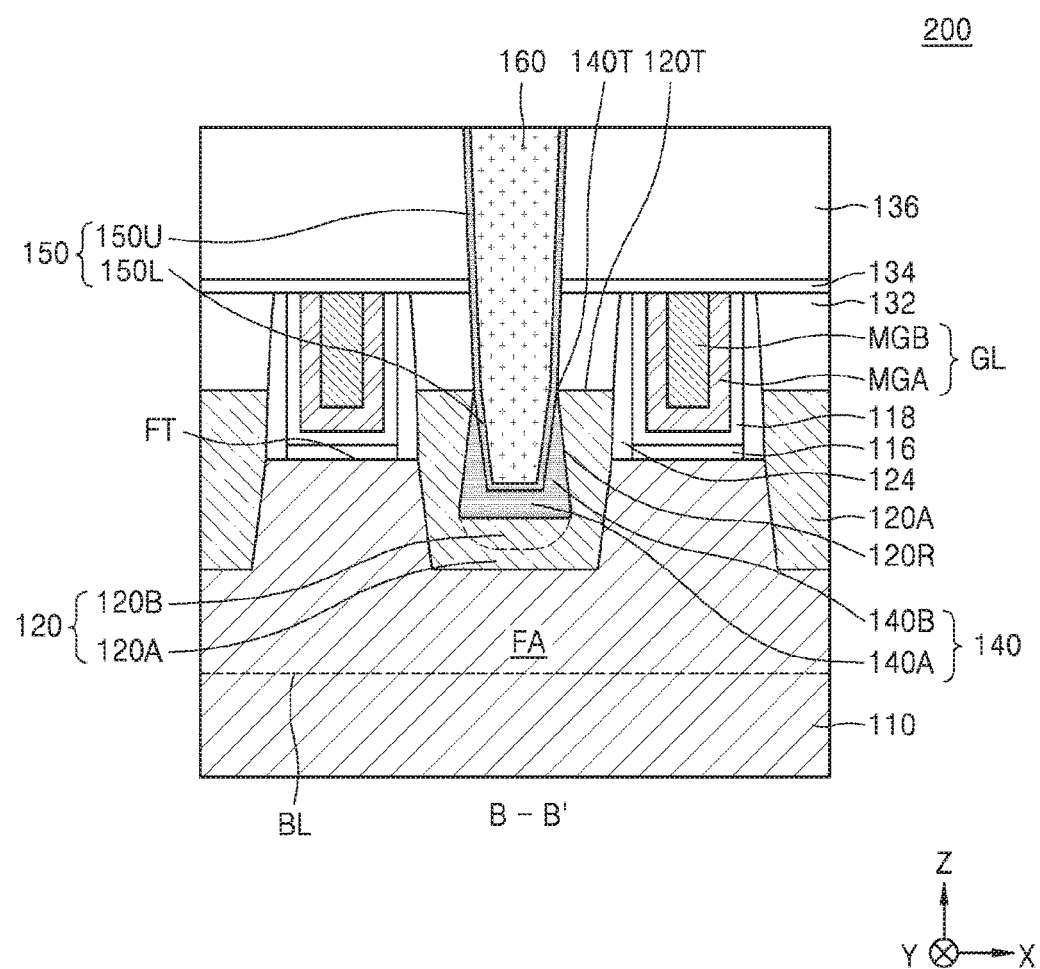
FIG. 16 is a cross-sectional view of another example of an integrated circuit device according to the inventive concept, showing a cross section of the device corresponding to the cross section of the integrated circuit device shown in FIG. 1A.

FIG. 16 illustrates an integrated circuit device 200 according to the inventive concept.

The integrated circuit device 200 may have approximately the same layout as that of the integrated circuit device 100 illustrated in FIG. 1A. In FIG. 16, elements similar to those in FIGS. 1A through 1D are denoted by the same reference numerals, and a detailed explanation thereof will be omitted.

Referring to FIG. 16, the integrated circuit device 200 has approximately the same structure as that of the integrated circuit device 100 illustrated in FIGS. 1A through 1D except that the metal layer 130 (see FIGS. 1A through 1D) between the lower barrier layer 150L of the conductive barrier layer 150 and the metal silicide layer 140 is omitted.

In the integrated circuit device 200, the lower barrier layer 150L of the conductive barrier layer 150 contacts the metal silicide layer 140.

In an example of a method of manufacturing the integrated circuit device 200 illustrated in FIG. 16, metal layer 130 is formed by the method described with reference to FIGS. 11A through 12B to a relatively small thickness. Also, the metal silicide layer 140 is formed as described with reference to FIGS. 14A and 14B, in an annealing process in which all portions of the relatively thin metal layer 130 are silicidated.

Figure 17:
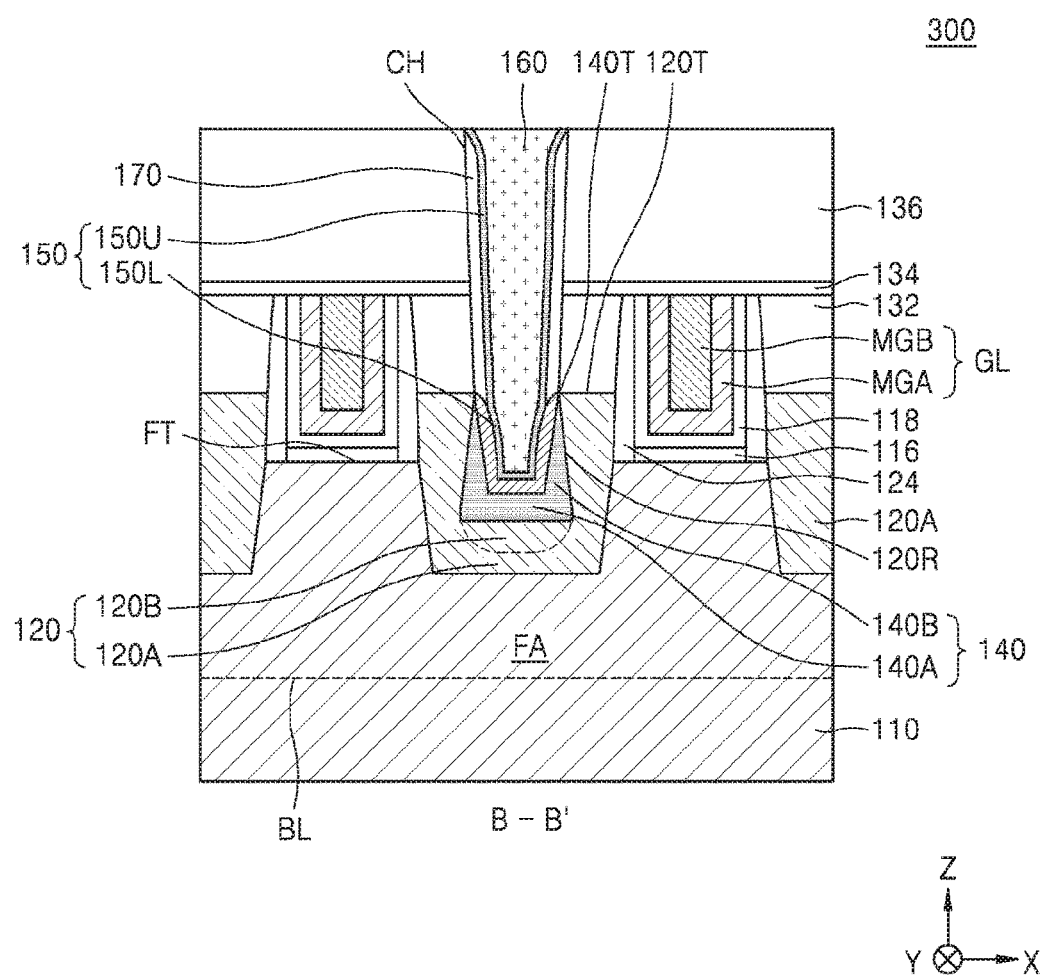
FIG. 17 is a cross-sectional view of still another example of an integrated circuit device according to the inventive concept, also showing a cross section of the device corresponding to the cross section of the integrated circuit device shown in FIG. 1A.

FIG. 17 is illustrates an integrated circuit device 300 according to the inventive concept.

The integrated circuit device 300 may have approximately the same layout as that of the integrated circuit device 100 illustrated in FIG. 1A. In FIG. 17, elements similar to those in FIGS. 1A through 1D are denoted by the same reference numerals, and a detailed explanation thereof will be omitted.

Referring to FIG. 17, the integrated circuit device 300 has approximately the same structure as that of the integrated circuit device 100 illustrated in FIGS. 1A through 1D except that the integrated circuit device 300 further includes an additional barrier layer 170 surrounding the upper portion 150U of the conductive barrier layer 150.

In the integrated circuit device 300, the additional barrier layer 170 may vertically extend in the contact hole CH so as to be interposed between the upper portion 150U of the conductive barrier layer 150 and the inter-gate insulation layer 132, between the upper portion 150U of the conductive barrier layer 150 and the blocking insulation layer 134, and between the upper portion 150U of the conductive barrier layer 150 and the interlayer insulation layer 136.

The additional barrier layer 170 may be formed of a material that is different from a constituent material of the conductive barrier layer 150. The additional barrier layer 170 may be formed of a conductive material or an insulating material. For example, the additional barrier layer 170 may be formed of a silicon nitride, an aluminum nitride or a combination thereof, but the inventive concept is not limited thereto. The additional barrier layer 170 may be a single layer or a laminate of a plurality of layers.

In a process of manufacturing the integrated circuit device 300 including the additional barrier layer 170 illustrated in FIG. 17, after the metal layer 130 is formed as described with reference to FIGS. 12A and 12B, and before the conductive barrier layer 150 is formed as described with reference to FIGS. 13A and 13B, an additional barrier material layer lining the contact hole CH may be formed, and then a portion of the additional barrier material layer may be removed using an etch-back process so as to form the additional barrier layer 170 covering sides of the contact hole CH. Next, the series of processes described with reference to FIG. 13A through 15B may be performed on the resultant product, on which the additional barrier layer 170 is formed, thereby completing the integrated circuit device 300 illustrated in FIG. 17.

Figure 18:
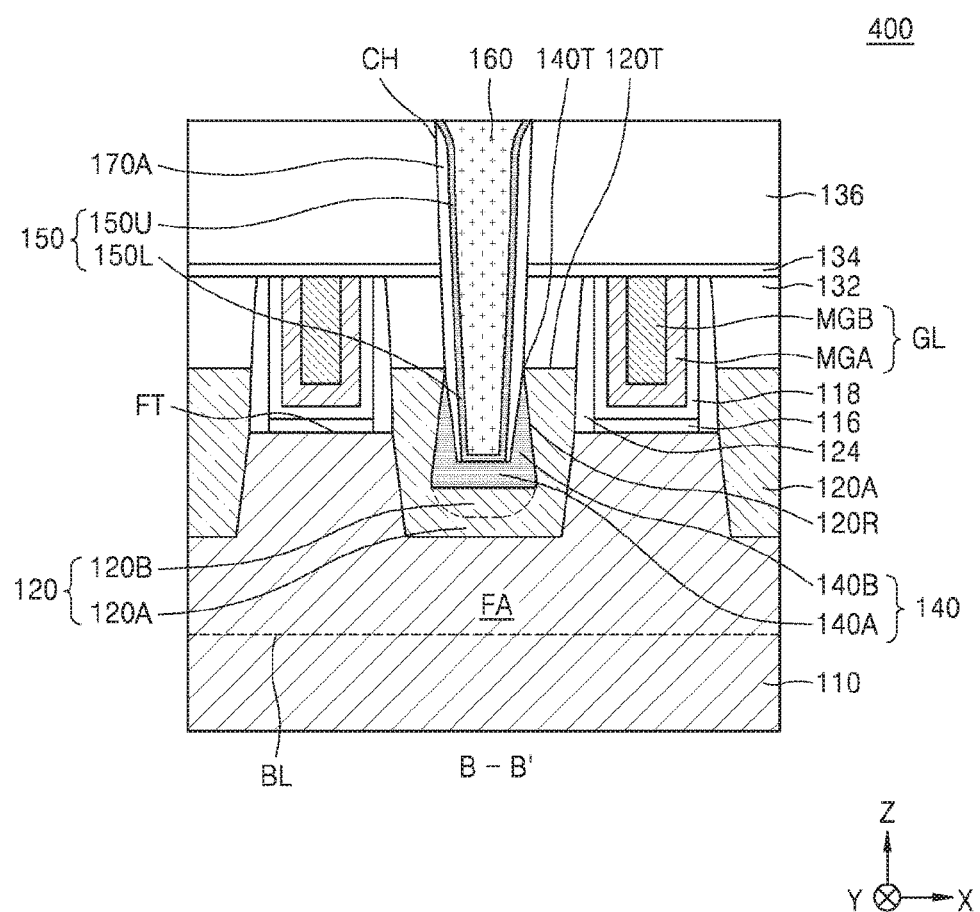
FIG. 18 is a cross-sectional view of still another example of an integrated circuit device according to the inventive concept, again showing a cross section of the device corresponding to the cross section of the integrated circuit device shown in FIG. 1A.

FIG. 18 illustrates an integrated circuit device 400 according to the inventive concept.

The integrated circuit device 400 illustrated in FIG. 18 may have approximately the same layout as that of the integrated circuit device 100 illustrated in FIG. 1A. In FIG. 18, elements similar to those illustrated in FIGS. 1A through 1D and FIG. 16 are denoted by the same reference numerals, and a detailed explanation thereof will be omitted.

Referring to FIG. 18, the integrated circuit device 400 has approximately the same structure as that of the integrated circuit device 200 illustrated in FIG. 16 except that the integrated circuit device 400 further includes an additional barrier layer 170A surrounding the upper 150U and lower 150L portions of the conductive barrier layer 150.

In the integrated circuit device 400, the additional barrier layer 170A may vertically extend in the contact hole CH so as to be interposed between the upper portion 150U of the barrier layer 150 and the inter-gate insulation layer 132, between the upper barrier layer 150U and the blocking insulation layer 134, between the upper portion 150U of the barrier layer 150 and the interlayer insulation layer 136, and between the lower portion 150L of the barrier layer 150 and the metal silicide layer 140. Also, the lower portion 150L of the conductive barrier layer 150 may contact the second portion 140B of the metal silicide layer 140.

The constituent materials of the additional barrier layer 170A are the same as those of the additional barrier layer 170 described with reference to FIG. 17.

In a process of manufacturing the integrated circuit device 400 including the additional barrier layer 170A illustrated in FIG. 18, a metal layer 130 is formed as described with reference to FIGS. 11A through 12B to a relatively small thickness. Also, before the metal silicide layer 140 is formed on the metal layer 130, an additional barrier material layer lining the contact hole CH may be formed, and then a portion of the additional barrier material layer may be removed using an etch-back process so as to form the additional barrier layer 170A along the sides of the contact hole CH. Next, the conductive barrier layer 150 is formed, on the resultant product on which the additional barrier layer 170A is formed, by a method similar to that described with reference to FIGS. 13A and 13B, and the resultant product on which the conductive barrier layer 150 is formed may be annealed according to the method described with reference to FIGS. 14A and 14B until all portions of the relatively thin metal layer 130 are silicidated. Next, processes similar to those described with reference to FIGS. 15A and 15B are performed such that the integrated circuit device 400 illustrated in FIG. 18 is obtained.

Figure 19A:
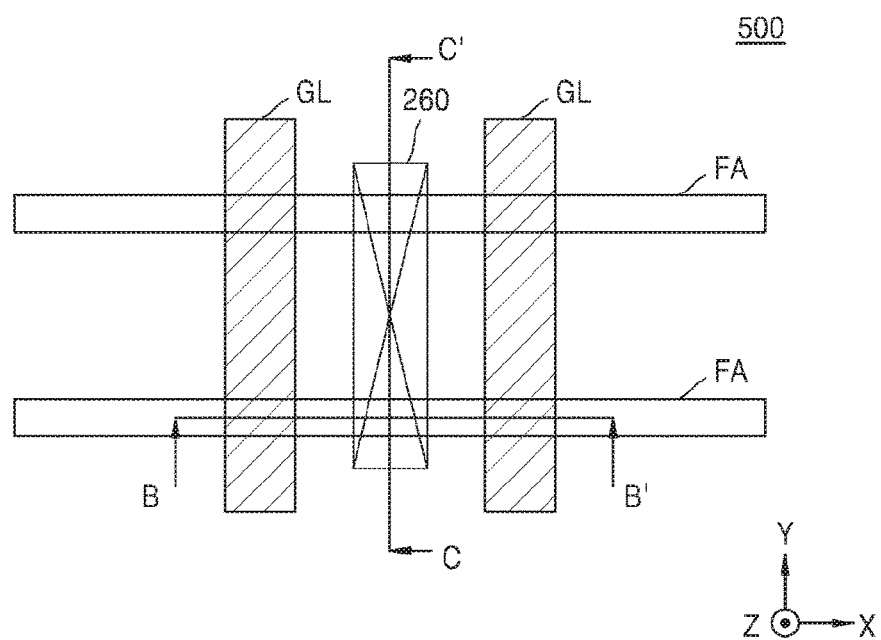
FIG. 19A is a layout diagram of another example of an integrated circuit device according to the inventive concept.
Figure 19B:
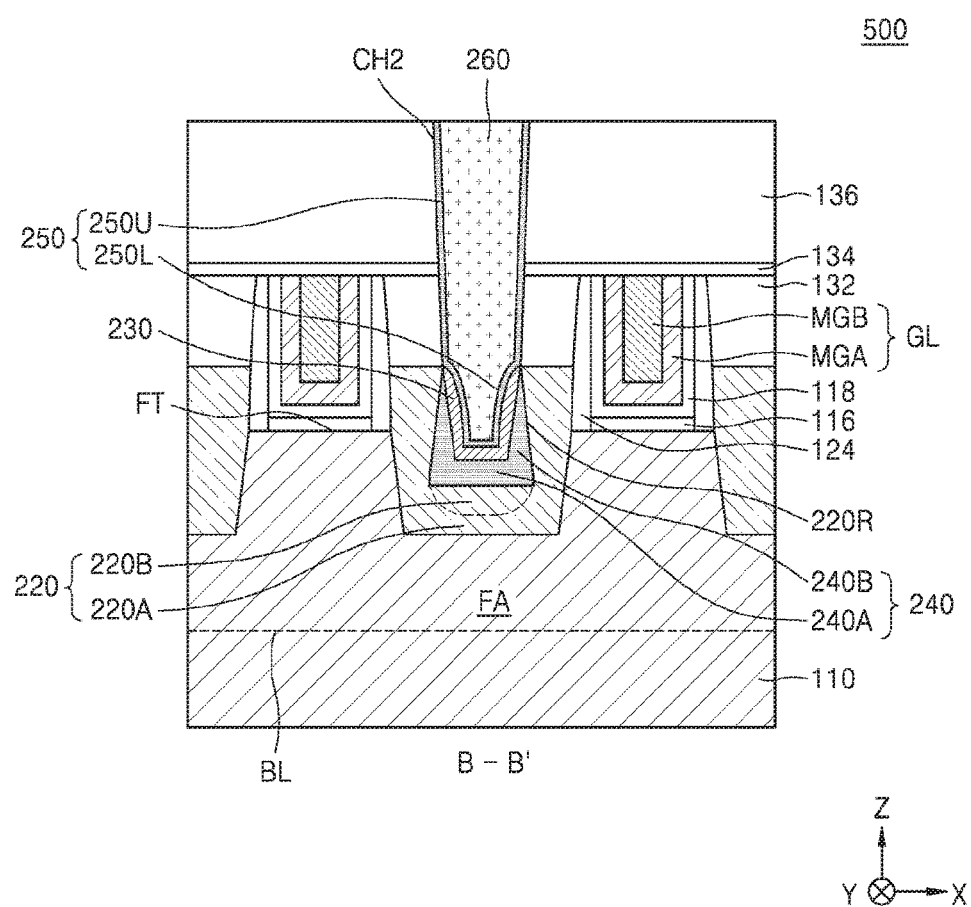
FIG. 19B is a cross-sectional view of the integrated circuit device taken along line B-B' of FIG. 19A.
Figure 19C:
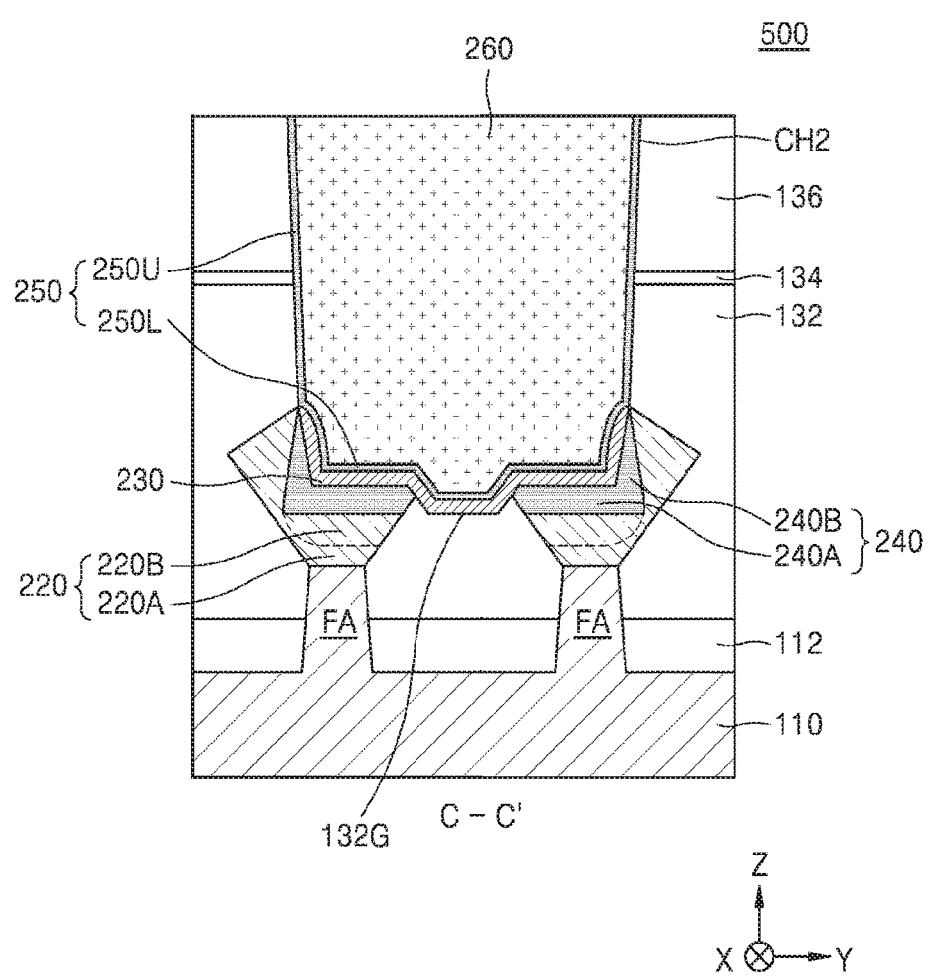
FIG. 19C is a cross-sectional view of the integrated circuit device taken along line C-C' of FIG. 19A.

FIGS. 19A through 19C illustrate another example of an integrated circuit device 500 according to the inventive concept. In FIGS. 19A through 19C, elements similar to those in FIGS. 1A through 1D are denoted by the same reference numerals, and a detailed explanation thereof will be omitted.

The integrated circuit device 500 illustrated in FIGS. 19A through 19C has approximately the same structure as that of the integrated circuit device 100 described with reference to FIGS. 1A through 1D. However, the integrated circuit device 500 includes a plurality of fin-type active regions FA extending parallel to one another on a main surface (X-Y plane) of the substrate 110. A plurality of gate lines GL extend parallel to one another in the second direction (Y direction) across the plurality of fin-type active regions FA.

A source/drain region 220 is formed on each of the sides of the gate lines GL at upper portions of the plurality of fin-type active regions FA.

A contact plug 260 extends over two adjacent ones of the fin-type active regions FA in the second direction (Y direction). The contact plug 260 is electrically connected to the two adjacent fin-type active regions FA via the source/drain region 220 at the upper portions of the two fin-type active regions FA.

The contact plug 260 extends, from within a recess 220R formed in the top surface of the source/drain region 220, in the third direction (Z direction) perpendicular to the main surface (X-Y plane) of the substrate 110. The contact plug 260 may be electrically connected to two adjacent source/drain regions 220 by passing through the interlayer insulation layer 136, the blocking insulation layer 134, and the inter-gate insulation layer 132.

The contact plug 260 may be surrounded by the inter-gate insulation layer 132, the blocking insulation layer 134, and the interlayer insulation layer 136 so as to be insulated from other nearby conductive layers. The contact plug 260 may be formed of W, Cu, Al, an alloy of one of such metals, or a combination thereof, but the inventive concept is not limited thereto.

A metal silicide layer 240 is interposed between the source/drain region 220 and the contact plug 260. The metal silicide layer 240 extends over surfaces that define the recess 220R.

A bottom surface and the sides of the contact plug 260 are surrounded by a conductive barrier layer 250. The conductive barrier layer 250 has a lower portion 250L facing the metal silicide layer 240 and an upper portion 250U disposed on the lower portion 250L and surrounding the contact plug 260.

A metal layer 230 formed of the same metal as that constituting the metal silicide layer 240 may be interposed between the metal silicide layer 240 and the lower barrier layer 250L. In another example, though, the metal layer 230 is omitted. In this case, the metal silicide layer 240 and the lower barrier layer 250L contact each other.

The metal silicide layer 240 includes a first portion 240A covering the bottom surface of the contact plug 260 and a second portion 240B that is integral with the first portion 240A and covers the sides of the contact plug 260. The second portion 240B of the metal silicide layer 240 may have a smaller thickness than the first portion 240A. The second portion 240B of the metal silicide layer 240 may extend completely around the contact plug. The second portion 240B of the metal silicide layer 240 may have a thickness that decreases in a direction away from the substrate 110.

Other features and aspects of the metal silicide layer 240 are the same as those described with respect to the metal silicide layer 140 with reference to FIGS. 1A through 1D.

Similar to the source/drain region 120 described with reference to FIGS. 1A through 1D, the source/drain region 220 may include a crystalline semiconductor region 220A and a local amorphous semiconductor region 220B. The local amorphous semiconductor region 220B may be interposed between the metal silicide layer 240 and the crystalline semiconductor region 220A. The local amorphous semiconductor region 220B may be interposed between the first portion 240A of the metal silicide layer 240 and the crystalline semiconductor region 220A. In another example, the local amorphous semiconductor region 220B is interposed between the first portion 240A of the metal silicide layer 240 and the crystalline semiconductor region 220A and between the second portion 240B of the metal silicide layer 240 and the crystalline semiconductor region 220A.

Overall, the source/drain region 220, the metal layer 230, the metal silicide layer 240, the conductive barrier layer 250, and the contact plug 260 are the same as the source/drain region 120, the metal layer 130, the metal silicide layer 140, the conductive barrier layer 150, and the contact plug 160 described with reference to FIGS. 1A through 1D.

To manufacture the integrated circuit device 500 illustrated in FIGS. 19A through 19C, processes similar to those described with reference to FIGS. 2A through 15B may be performed. However, when performing a process corresponding to the process of forming the contact hole CH as described with reference to FIGS. 8A and 8B, instead of forming a contact hole CH that exposes only one source/drain region 120, one contact hole CH2 having a relatively great width in the Y direction is formed so that two adjacent source/drain regions 220 are exposed through a bottom surface of the contact hole CH2. Also, in a process corresponding to the forming of the recess 120R described with reference to FIGS. 9A and 9B, the two source/drain regions 220 and the inter-gate insulation layer 132 between the two source/drain regions 220 exposed through the bottom of the contact hole CH2 may be etched together. An etching speed of the source/drain regions 220 may be higher than an etching speed of the inter-gate insulation layer 132. Accordingly, a groove 132G may be formed in the top surface of the inter-gate insulation layer 132 between the two adjacent source/drain regions 220. Then, the integrated circuit device 500 may be manufactured by performing processes similar to those described with reference to FIGS. 10A through 15B.

Figure 20:
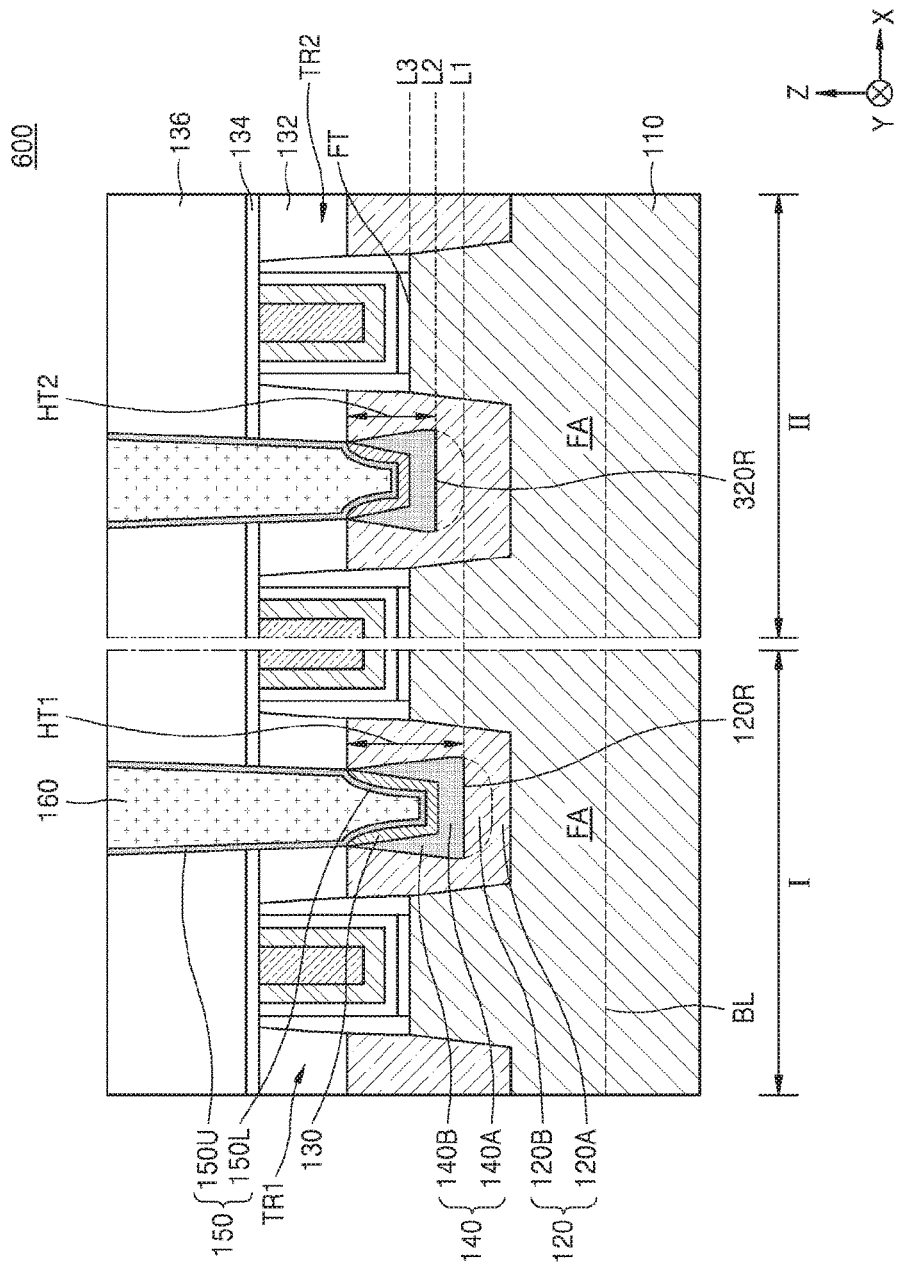
FIG. 20 is a cross-sectional view of another example of an integrated circuit device according to the inventive concept.

FIG. 20 illustrates illustrating an integrated circuit device 600 according to the inventive concept.

In FIG. 20, elements similar to those in FIGS. 1A through 1D are denoted by the same reference numerals, and a detailed explanation thereof will be omitted.

Referring to FIG. 20, the substrate 110 spans a first device region I and a second device region II of the integrated circuit device 600.

The first device region I and the second device region II may have different electrical characteristics. The first device region I and the second device region II may be regions where transistors of different channel-types are formed. For example, the first device region I may be a region including a PMOS transistor TR1, and the second device region II may be a region including an NMOS transistor TR2.

The first device region I and the second device region II may each have a structure similar to that described with reference to FIGS. 1A through 1D. However, a first level L1 which is a bottom level of the metal silicide layer 140 of the PMOS transistor TR1 formed in the first device region I may be different from a second level L2 which is a bottom level of the metal silicide layer 140 of the NMOS transistor TR2 formed in the second region II. For example, as illustrated in FIG. 20, the first level L1 may be below the second level L2, and thus, the first level L1 may be closer to the bottom of the fin-type active regions FA than the second level L2. Also, the first level L1 and the second level L2 may be each lower than a third level L3 which is a level of the top surface FT of the fin-type active regions FA, and thus the second level L2 may be closer to the top surface FT of the fin-type active regions FA than the first level L1 is.

The bottom of the recess 120R formed in the source/drain region 120 in the first device region I may be situated at the first level L1. Also, the bottom of a recess region 320R formed in the source/drain region 120 in the second device region II may be situated at second level L2. On the other hand, the top surfaces of the source/drain regions 120 formed in each of the first device region I and the second device region II may be situated at the same levels, i.e., may be coplanar. Accordingly, the height HT1 in the third direction (Z direction) of the second portion 140B of the metal silicide layer 140 in the first device region I may be greater than the height HT2 in the third direction (Z direction) of the second portion 140B of the metal silicide layer 140 in the second device region II.

In the first device region I and the second device region II, the second portion 140B of the metal silicide layer 140 may have a thickness that decreases in a direction away from the substrate 110.

Also, in the first device region I and the second device region II, the first portion 140A and the second portion 140B of the metal silicide layer 140 may each contain a dopant. The dopant may be at least one element selected from the group consisting of Ge, C, Ar, Kr, and Xe.

In order to manufacture the integrated circuit device 600 illustrated in FIG. 20, processes similar to those described with reference to FIGS. 2A through 15B may be performed. However, the process of forming of the contact hole CH described with reference to FIGS. 8A and 8B and of forming the recess 120R described with reference to FIGS. 9A and 9B may be independently performed with respect to each of the first device region I and the second device region II. More specifically, a recess 120R having a relatively great depth may be formed in the first device region I, and a recess region 120R having a smaller depth than the depth of the recess 120R formed in the first device region I may be formed in the second device region II by performing respective sets of the processes described with reference to FIGS. 8A through 9B. Next, the processes described with reference to FIGS. 10A through 15B may be simultaneously performed on the first device region I and the second device region II to thereby complete the integrated circuit device 600 illustrated in FIG. 20.

Figure 21:
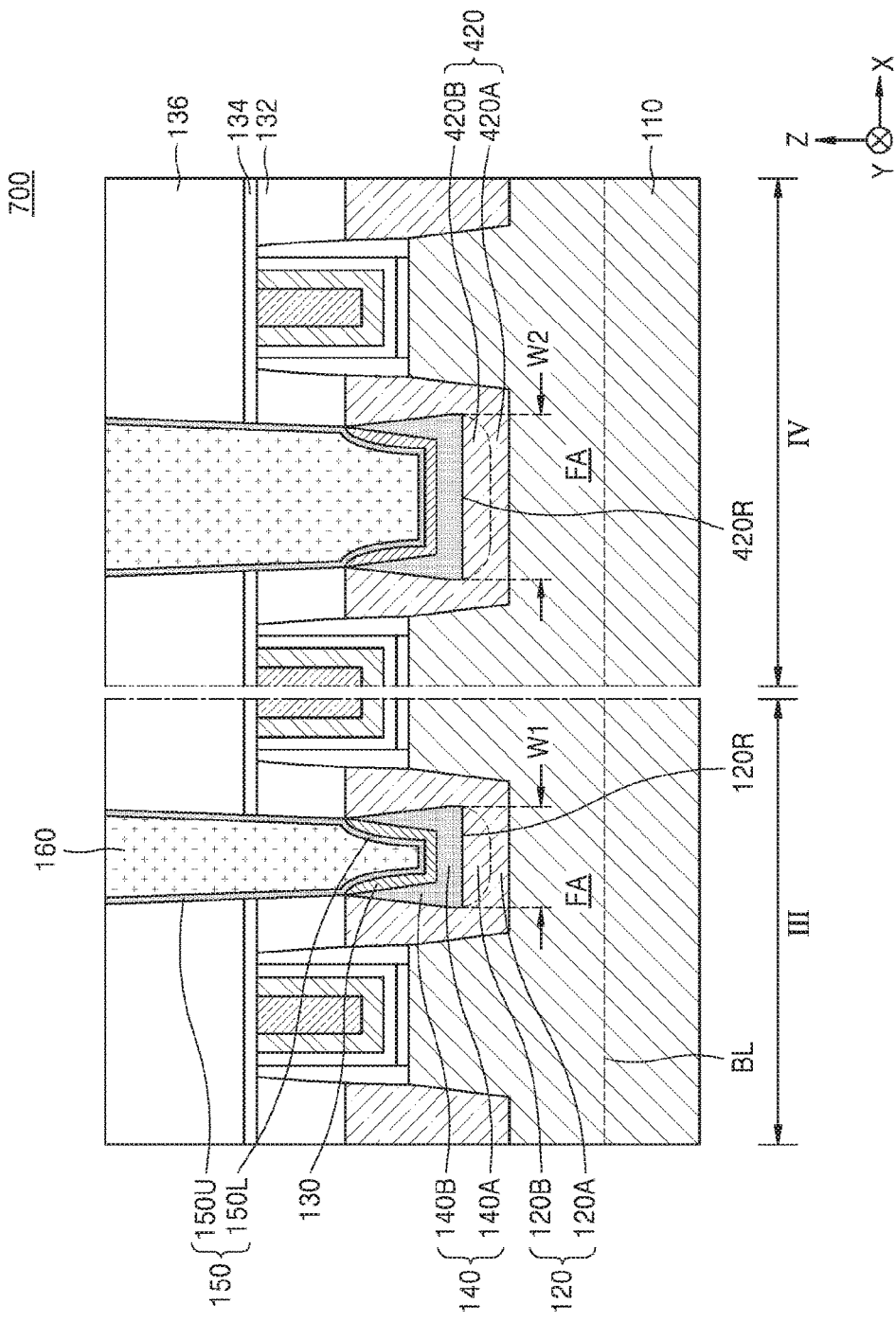
FIG. 21 is a cross-sectional view of still another example of an integrated circuit device according to the inventive concept.

FIG. 21 illustrates an integrated circuit device 700 according to the inventive concept. In FIG. 21, elements similar to those of the example of FIGS. 1A through 1D are denoted by the same reference numerals, and a detailed explanation thereof will be omitted.

Referring to FIG. 21, the substrate 110 spans respective regions of the device, arbitrarily referred to here as a third device region III and a fourth device region IV, respectively.

The third device region III and the fourth device region IV may be regions of the device at which different functions are performed. For example, the third device region III may be a region where devices operating in a low power mode are located, and the fourth device region IV may be a region where devices operating in a high power mode are located. In one example, the third device region III is a region where a memory device or a logic circuit is disposed, and the fourth device region IV is a region where a peripheral circuit such as an input/output (I/O) device is disposed.

In the illustrated example of FIG. 21, the third device region III and the fourth device region IV have approximately the same structure. However, a pattern density in the fourth device region IV may be lower than that in the third device region III. In this respect, a width of a source/drain region 420 in the fourth device region IV may be greater than a width of the source/drain region 120 in the third device region III. The source/drain region 420 in the fourth device region IV may include a crystalline semiconductor region 420A and a local amorphous semiconductor region 420B.

A width W2 of the metal silicide layer 140 in a recess 420R of the source/drain region 420 in the fourth device region IV may be greater than a width W1 of the metal silicide layer 140 in the recess 120R of the source/drain region 120 in the third device region III Similarly, widths of the metal layer 130, the conductive barrier layer 150, and the contact plug 160 sequentially on the metal silicide layer 140 in fourth device region IV may be respectively greater than widths of corresponding elements in the third device region III.

Figure 22:
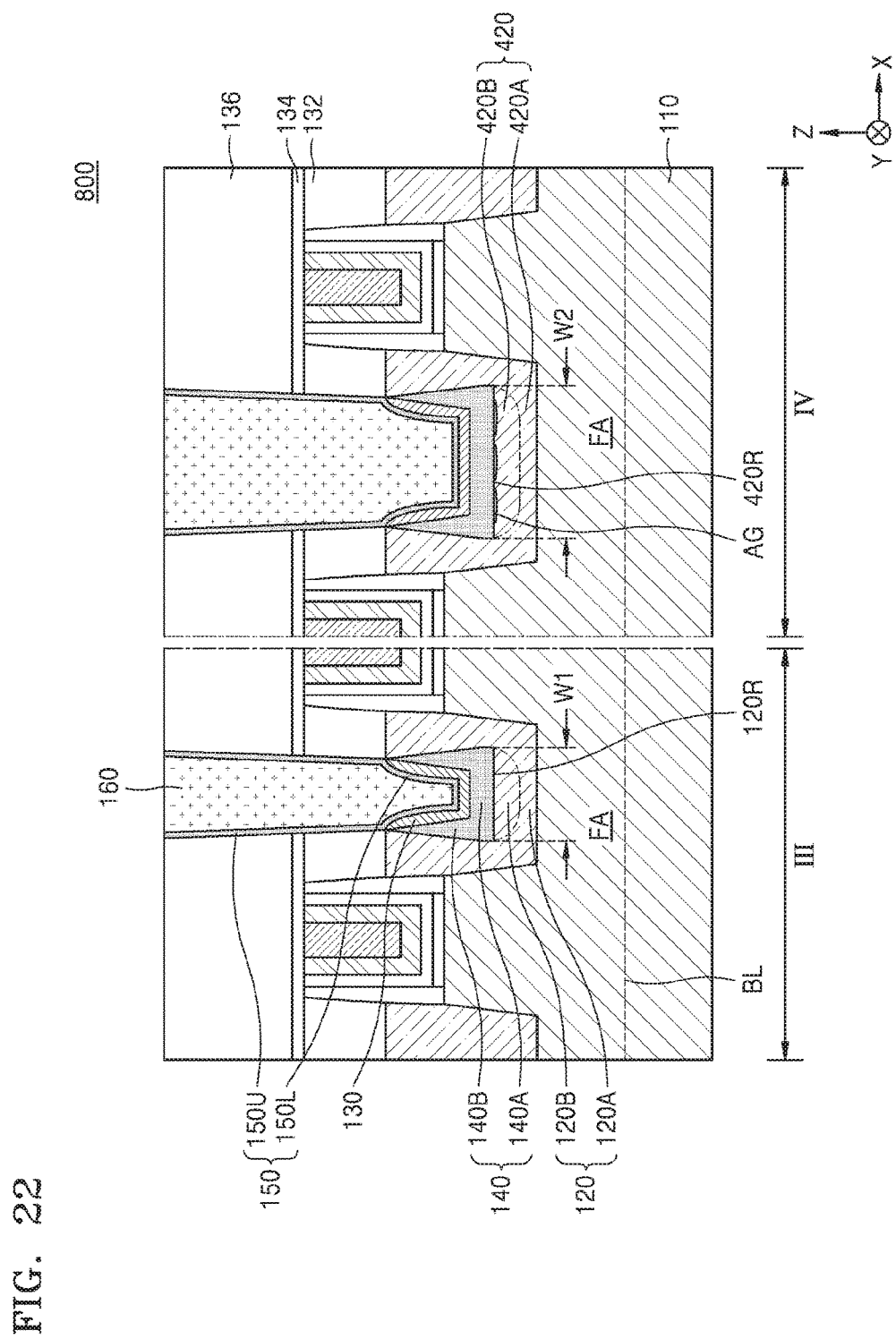
FIG. 22 is a cross-sectional view of still another example of an integrated circuit device according the inventive concept.

FIG. 22 illustrates an integrated circuit device 800 according to the inventive concept. In FIG. 22, elements similar to those illustrated in FIG. 21 are denoted by the same reference numerals, and a detailed explanation thereof will be omitted.

Referring to FIG. 22, the integrated circuit device 800 has approximately the same structure as the integrated circuit device 700 illustrated in FIG. 21. However, in the fourth device region IV, at least one air gap AG is formed locally in the local amorphous semiconductor region 420B in the source/drain region 420, adjacent to an interface with the metal silicide layer 140.

Although FIG. 22 shows a plurality of spaced apart or discrete air gaps AG along the interface between the local amorphous semiconductor region 420B and the metal silicide layer 140, the inventive concept is not so limited. Rather, one or more air gaps AG of various shapes may be defined in a select portion of the local amorphous semiconductor region 420B that is adjacent to a bottom and/or sides of the recess region 420R. For example, the integrated circuit device 800 may include one long air contiguous gap AG that extends in a portion of the local amorphous semiconductor region 420B at its interface with the metal silicide layer 140.

The at least one air gap AG may be formed as a result of forming the metal silicide layer 140 using the local amorphous semiconductor region 420B that extends over a relatively broad area in the fourth device region IV. For example, the air gap may be formed due to movement of silicon atoms, in the broader local amorphous semiconductor region 420B in the fourth device region IV, while the fourth device region IV is annealed to silicidize the metal layer 130.

The examples of the integrated circuit devices 100, 200, 300, 400, 500, 600, 700, and 800 according to the inventive concept, described with reference to FIGS. 1A through 22, each include metal silicide layer 140 or 240 lining not only the bottoms but also the sides of the recesses 120R, 220R, and 420R respectively formed in the source/drain regions 120, 220, and 420. Also, when forming the metal silicide layer 140 or 240 lining the bottoms and the sides of the recesses 120R, 220R, and 420R, a CVD process which requires a high temperature of about 400° C. or higher is not used. Rather, a relatively low temperature process may be used, e.g., a PVD process conducted at room temperature. Accordingly, a contact resistance characteristic between the source/drain regions 120, 220, and 420 and the contact plug 160 may be improved.

Furthermore, although the inventive concept has been described with reference to integrated circuit devices including a FinFET having a three-dimensional channel and to methods of manufacturing the same as illustrated in FIGS. 1A through 22, the inventive concept is not limited thereto. For example, it will be obvious to one of ordinary skill in the art that various changes and modifications may be made to these examples of the inventive concept and integrated circuit devices including a horizontal (planar) MOSFET and a method of manufacturing the same may also be provided.

Figure 23A:
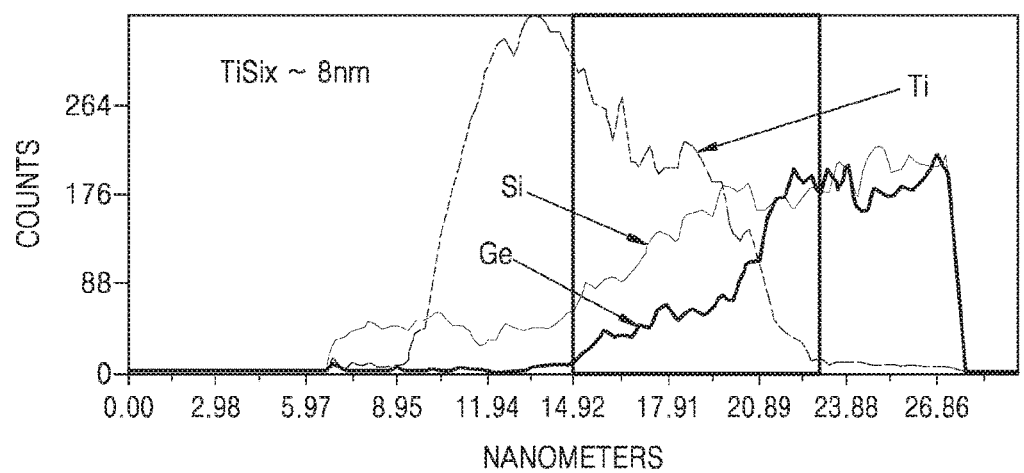
FIGS. 23A and 23B are each a graph showing a result of component analysis of a metal silicide layer formed on a source/drain region formed using a method of manufacturing an integrated circuit device according to the inventive concept, and layers around the metal silicide layer.
Figure 23B:
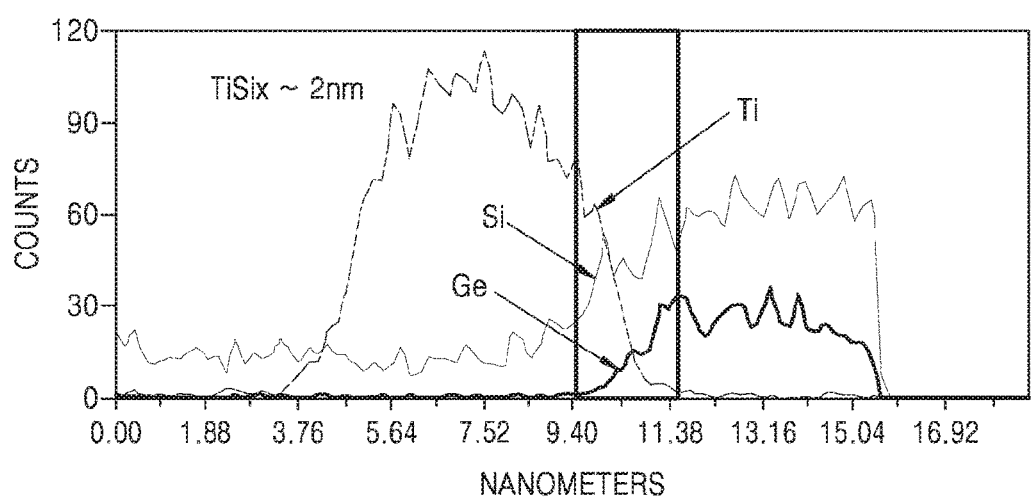

FIGS. 23A and 23B are graphs showing a result of component analysis of a metal silicide layer formed on a source/drain region formed using a method according to the inventive concept, and layers around the metal silicide layer.

More specifically, FIGS. 23A and 23B show a result of analysis of a structure in which a titanium silicide (TiSix) layer lines a bottom and sides of a recess formed in an SiGe source/drain region, wherein FIG. 23A shows a result of analysis of that portion of the metal silicide layer lining the bottom of the recess in the source/drain region, and FIG. 23B shows a result of analysis of a portion of the metal silicide layer lining sides of the recess formed in the source/drain region.

In the example whose results are shown in FIGS. 23A and 23B, the portion of the metal silicide layer lining the bottom of the recess has a thickness of about 8 nm, and the portion of the metal silicide layer lining the sides of the recess has a thickness of about 2 nm.

Figure 24:
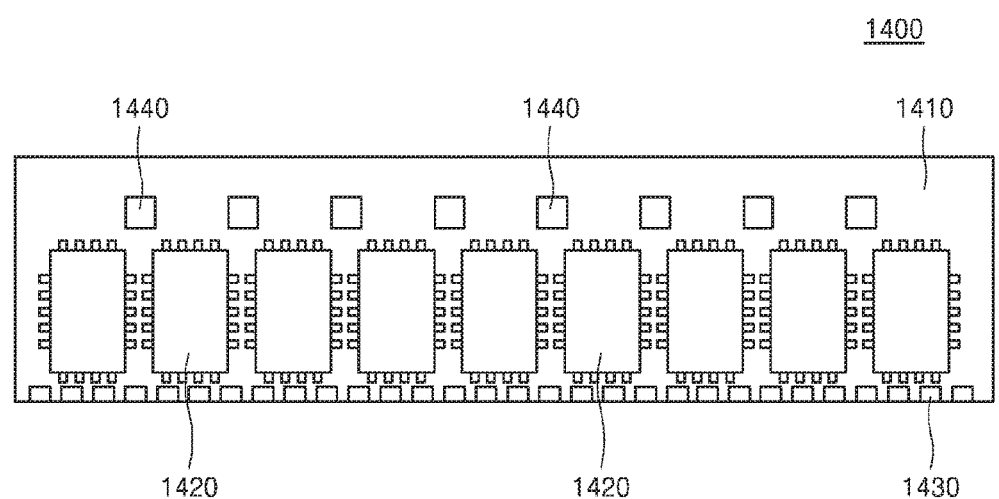
FIG. 24 is a plan view of a memory module according to the inventive concept.

FIG. 24 is a plan view of one example of a memory module 1400 according to the inventive concept.

The memory module 1400 includes a module substrate 1410 and a plurality of semiconductor chips 1420 attached to the module substrate 1410.

Each semiconductor chip 1420 may include an integrated circuit device according to the inventive concept, e.g., at least one of the integrated circuit devices 100, 200, 300, 400, 500, 600, 700, and 800 described with reference to FIGS. 1A through 22.

A connection portion 1430 that can be inserted into a socket of a mother board is disposed at a side of the module substrate 1410. A ceramic decoupling capacitor 1440 is disposed on the module substrate 1410.

Figure 25:
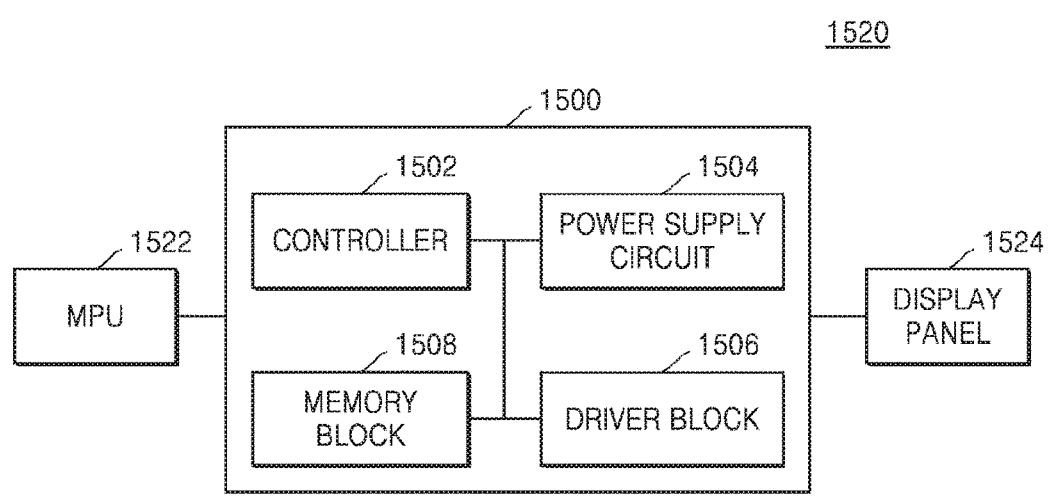
FIG. 25 is a block diagram of a display apparatus including an example of a display driver IC (DDI) according the inventive concept.

FIG. 25 illustrates a display driver IC (DDI) 1500 according to the inventive concept in the context of a display apparatus 1520 including the DDI 1500.

Referring to FIG. 25, the DDI 1500 may include a controller 1520, a power supply circuit 1504, a driver block 1506, and a memory block 1508. The controller 1502 receives a command from a main processing unit (MPU) 1522 to decode the same, and controls each block of the DDI 1500 to perform an operation according to the command. The power supply circuit unit 1504 generates a driving voltage in response to the control of the controller 1502. The driver block 1506 drives the display panel 1524 by using the driving voltage generated by the power supply circuit unit 1504 in response to the control of the controller 1502. The display panel 1524 may be a liquid crystal display panel or a plasma display panel. The memory block 1508 may be a block that temporarily stores a command input to the controller 1502 or control signals output from the controller 1502 or stores necessary data, and may include a memory such as a RAM or a read only memory (ROM). At least one of the power supply circuit unit 1504 and the driver block 1506 includes at least one integrated circuit device according to the inventive concept, e.g., at least one of the integrated circuit devices 100, 200, 300, 400, 500, 600, 700, and 800 described with reference to FIGS. 1A through 22.

Figure 26:
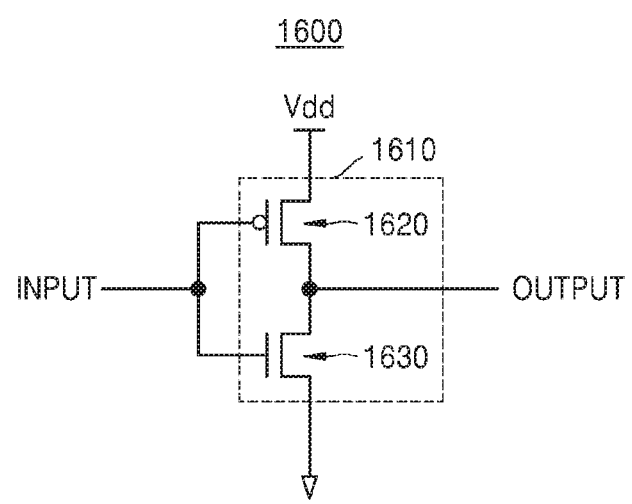
FIG. 26 is a circuit diagram of a complementary metal oxide semiconductor (CMOS) inverter according to the inventive concept.

FIG. 26 is a circuit diagram illustrating a CMOS inverter 1600 according to the inventive concept.

The CMOS inverter 1600 includes a CMOS transistor 1610. The CMOS transistor 1610 is formed of a PMOS transistor 1620 and an NMOS transistor 1630 connected between a power terminal Vdd and a ground terminal. The CMOS transistor 1610 includes at least one integrated circuit device according to the inventive concept, e.g., at least one of the integrated circuit devices 100, 200, 300, 400, 500, 600, 700, and 800 described with reference to FIGS. 1A through 22.

Figure 27:
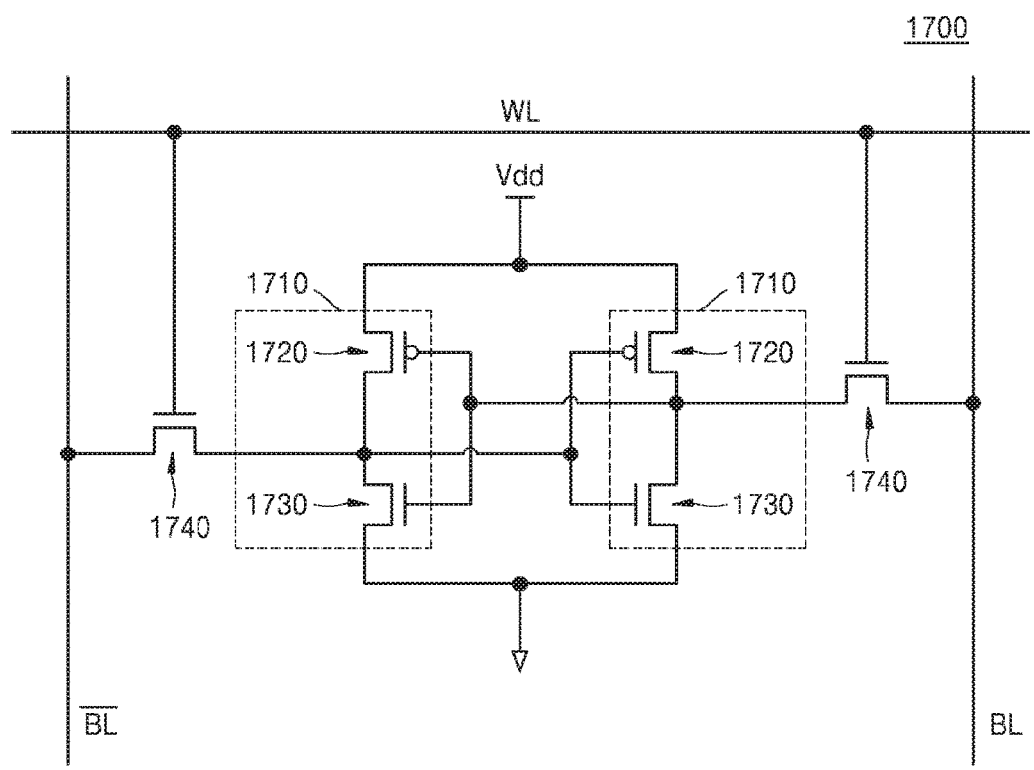
FIG. 27 is a circuit diagram of a CMOS static random access memory (SRAM) device according to the inventive concept.

FIG. 27 is a circuit diagram illustrating a CMOS SRAM device 1700 according to the inventive concept.

The CMOS SRAM device 1700 includes a pair of driving transistors 1710. The pair of driving transistors 1710 is formed of a PMOS transistor 1720 and an NMOS transistor 1730 connected between a power terminal Vdd and a ground terminal. The CMOS SRAM device 1700 further includes a pair of transmission transistors 1740. A source of the transmission transistors 1740 is cross-connected to the PMOS transistor 1720 and the NMOS transistor 1730 of the driving transistor 1710. A power terminal Vdd is connected to a source of the PMOS transistor 1720, and a ground terminal is connected to a source of the NMOS transistor 1730. A word line WL is connected to gates of the pair of transmission transistors 1740, and a bit line BL and an inverted bit line are respectively connected to drains of the pair of transmission transistors 1740.

At least one of the CMOS SRAM device 1700 and the driving transistor 1710 and the transmission transistors 1740 includes at least one of the integrated circuit devices according to the inventive concept, e.g., at least one of the integrated circuit devices 100, 200, 300, 400, 500, 600, 700, and 800 described with reference to FIGS. 1A through 22.

Figure 28:
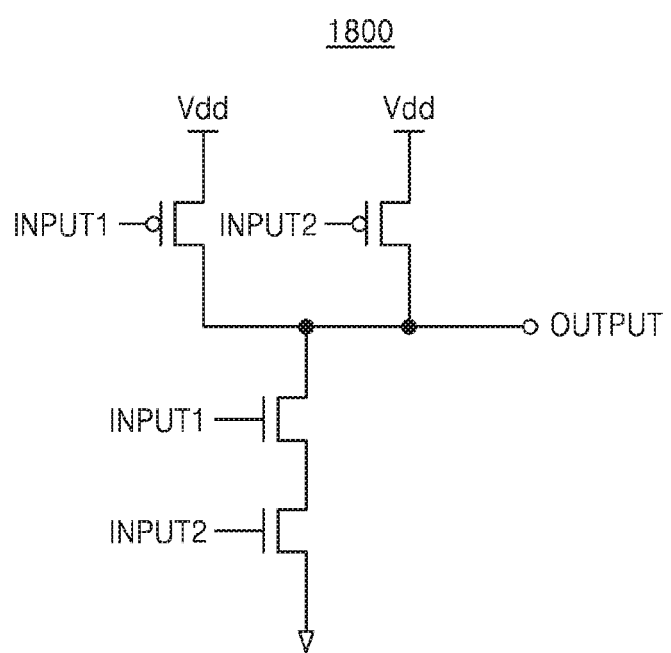
FIG. 28 is a circuit diagram of a CMOS NAND circuit according to the inventive concept.

FIG. 28 is a circuit diagram illustrating a CMOS NAND circuit 1800 according to the inventive concept.

The CMOS NAND circuit 1800 includes a pair of CMOS transistors to which different input signals are transmitted. The CMOS NAND circuit 1800 includes at least one integrated circuit device according to the inventive concept, e.g., at least one of the integrated circuit devices 100, 200, 300, 400, 500, 600, 700, and 800 described with reference to FIGS. 1A through 22.

Figure 29:
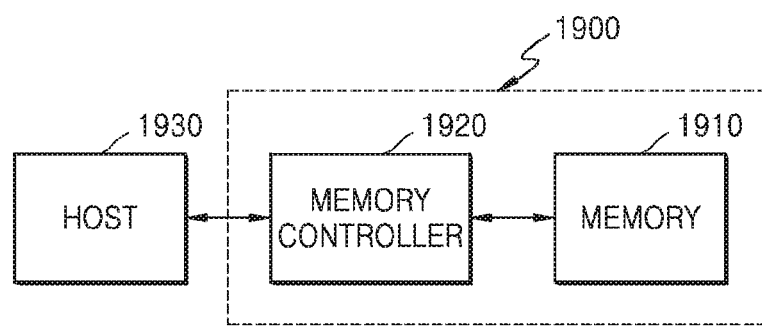
FIG. 29 is a block diagram of one example of electronic systems according to the inventive concept.

FIG. 29 is a block diagram illustrating an electronic system 1900 according to the inventive concept.

The electronic system 1900 includes a memory 1910 and a memory controller 1920. The memory controller 1920 controls the memory 1910 to read and/or write data from or to the memory 1910 in response to a request by the host 1930. At least one of the memory 1910 and the memory controller 1920 includes at least one integrated circuit device according to the inventive concept, e.g., at least one of the integrated circuit devices 100, 200, 300, 400, 500, 600, 700, and 800 described with reference to FIGS. 1A through 22.

Figure 30:
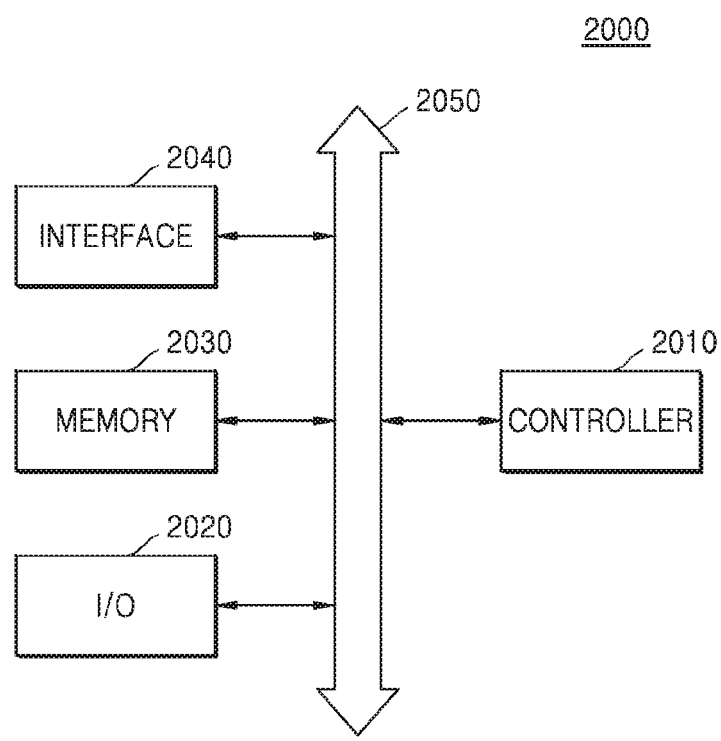
FIG. 30 is a block diagram of another example of electronic systems according to the inventive concept.

FIG. 30 is a block diagram illustrating an electronic system 2000 according to the inventive concept.

The electronic system 2000 includes a controller 2010, an input/output (I/O) device 2020, a memory 2030, and an interface 2040, which are connected to one another via a bus 2050.

The controller 2010 may include a microprocessor, a digital signal processor, or the like. The I/O device 2020 may include at least one of a keypad, a keyboard, and a display. The memory 2030 may be used to store a command executed by the controller 2010. For example, the memory 2030 may be used to store user data.

The electronic system 2000 may function as a wireless communication device or a device that is capable of transmitting and/or receiving information under a wireless communication environment. In order for the electronic system 2000 to transmit or receive data via a wireless communication network, the interface 2040 may be a wireless interface. The interface 2040 may include an antenna and/or a wireless transceiver. The electronic system 2000 may provide a communication interface protocol of a third generation communication system such as a code division multiple access (CDMA), global system for mobile communications (GSM), North American digital cellular (NADC), extended-time division multiple access E-TDMA, and/or wide band code division multiple access (WCDMA). The electronic system 2000 includes at least one integrated circuit device according to the inventive concept, e.g., at least one of the integrated circuit devices 100, 200, 300, 400, 500, 600, 700, and 800 described with reference to FIGS. 1A through 22.

Although the inventive concept has been particularly shown and described with reference to examples thereof, it will be understood that various changes in form and details may be made thereto without departing from the spirit and scope of the following claims.

What is claimed is:

1. An integrated circuit device comprising:
   a substrate having a main surface, and a fin-type active region projecting upright on the main surface and extending longitudinally in a first direction parallel to the main surface;
   a gate line extending in a second direction across the fin-type active region;
   a source/drain region at an upper part of the fin-type active region disposed to the side of the gate line, the source/drain region having a recess in an upper portion thereof;
   a contact plug extending from within the recess, in a third direction perpendicular to the main surface of the substrate, so as to be disposed on the source/drain region; and
   a metal silicide layer extending along surfaces of the source/drain region defining the recess, the metal silicide layer having a first portion covering a bottom surface of the contact plug and a second portion that is integral with the first portion and covers sides of a lower part of the contact plug, a thickness of the first portion in the third direction being different than a thickness of the second portion in a direction parallel to the main surface of the substrate.

2. The integrated circuit device of claim 1, wherein the thickness of the second portion of the metal silicide layer is less than the thickness of the first portion of the metal silicide layer.

3. The integrated circuit device of claim 1, wherein a thickness of the second portion of the metal silicide layer in the first direction is less than the thickness of the first portion of the metal silicide layer in the third direction.

4. The integrated circuit device of claim 1, wherein the second portion of the metal silicide layer extends around the contact plug.

5. The integrated circuit device of claim 1, wherein the second portion of the metal silicide layer has a thickness that decreases in the third direction away from the substrate.

6. The integrated circuit device of claim 1, wherein the metal silicide layer contains a dopant.

7. The integrated circuit device of claim 6, wherein the dopant includes at least one element selected from carbon group elements and inactive elements.

8. The integrated circuit device of claim 1, wherein the metal silicide layer has a composition represented by $MSi_xD_y$, wherein M is at least one metal, D is at least one element different from each metal M and Si, and $0<x\leq3$ and $0<y\leq1$.

9. The integrated circuit device of claim 8, wherein M is at least one metal selected from the group consisting of Ti, W, Ru, Nb, Mo, Hf, Ni, Co, Pt, Yb, Tb, Dy, Er, and Pd, and D is at least one element selected from the group consisting of Ge, C, Ar, Kr, and Xe.

10. The integrated circuit device of claim 1, wherein the source/drain region has an uppermost surface that is farthest from the main surface of the substrate in the third direction, the metal silicide layer has an uppermost part, and the uppermost surface and the uppermost part of the metal silicide layer lie in a common plane.

11. The integrated circuit device of claim 1, wherein the second portion of the metal silicide layer protrudes from a top surface of the fin-type active region in the third direction away from the substrate.

12. The integrated circuit device of claim 1, wherein the first portion of the metal silicide layer is situated at a level between that of a lowermost surface of the gate line and a top surface of the fin-type active region.

13. The integrated circuit device of claim 1, wherein a height of the contact plug is at least four times a height of the second portion of the metal silicide layer, as each measured from the bottom of the recess in the upper portion of the source/drain region.

14. The integrated circuit device of claim 1, wherein the source/drain region comprises a crystalline semiconductor region and a local amorphous semiconductor region that is interposed between the metal silicide layer and the crystalline semiconductor region.

15. The integrated circuit device of claim 14, wherein the local amorphous semiconductor region is interposed between the crystalline semiconductor region and the first portion of the metal silicide layer.

16. The integrated circuit device of claim 1, further comprising:
 a conductive barrier layer having a lower portion facing the metal silicide layer and extending around a lower portion of the contact plug, and an upper portion extending around an upper portion of the contact plug; and
 a metal layer interposed between the metal silicide layer and the lower portion of the barrier layer and being of the same material as a metal constituting the metal silicide layer.

17. An integrated circuit device comprising:
 a substrate spanning a first device region and a second device region of the device;
 a first channel-type transistor in the first device region; and
 a second channel-type transistor in the second device region,
 wherein the first channel-type transistor and the second channel-type transistor each include:
 a fin-type active region of the substrate extending longitudinally in a first direction,
 a gate line extending in a second direction across the fin-type active region,
 a source/drain region at an upper part of the fin-type active region and disposed to the side of the gate line, the source/drain region having a recess in an upper portion thereof,
 a contact plug extending from within the recess, in a third direction perpendicular to the main surface of the substrate, so as to be disposed on the source/drain region, and
 a metal silicide layer extending along surfaces of the source/drain region defining the recess,
 wherein the metal silicide layer has a first portion covering a bottom surface of the contact plug and a second portion that is integral with the first portion and covers sides of a lower part of the contact plug, a thickness of the first portion in the third direction being different than a thickness of the second portion in a direction parallel to the main surface of the substrate, and
 wherein a bottom of the metal silicide layer of the first channel-type transistor is situated at a level in the device different from that at which a bottom of the metal silicide layer of the second channel-type transistor is situated.

18. The integrated circuit device of claim 17, wherein a height of the second portion of the metal silicide layer of the first channel-type transistor, as measured in the third direction, is different from that of the second portion of the metal silicide layer of the second channel-type transistor.

19. The integrated circuit device of claim 17, wherein in each of the first channel-type transistor and the second channel-type transistor, the second portion of the metal silicide layer has a thickness that decreases the third direction away from the substrate.

20. The integrated circuit device of claim 17, wherein in each of the first channel-type transistor and the second channel-type transistor,
 the first portion and the second portion of the metal silicide layer each contain dopant of at least one element selected from the group consisting of Ge, C, Ar, Kr, and Xe.

* * * * *